United States Patent
Sumi et al.

(10) Patent No.: US 7,791,973 B2
(45) Date of Patent: Sep. 7, 2010

(54) ELECTRIC FUSE CIRCUIT AVAILABLE AS ONE TIME PROGRAMMABLE MEMORY

(75) Inventors: Shinichi Sumi, Hyogo (JP); Yasuhiro Agata, Osaka (JP); Masanori Shirahama, Shiga (JP); Toshiaki Kawasaki, Osaka (JP); Ryuji Nishihara, Osaka (JP)

(73) Assignee: Panasonic Corporation, Osaka (JP)

( * ) Notice: Subject to any disclaimer, the term of this patent is extended or adjusted under 35 U.S.C. 154(b) by 442 days.

(21) Appl. No.: 12/021,317

(22) Filed: Jan. 29, 2008

(65) Prior Publication Data

US 2008/0186789 A1    Aug. 7, 2008

(30) Foreign Application Priority Data

Feb. 5, 2007    (JP) .............................. 2007-024946

(51) Int. Cl.
*G11C 17/18*    (2006.01)
(52) U.S. Cl. ...................................... 365/225.7; 365/96
(58) Field of Classification Search .............. 365/225.7, 365/96
See application file for complete search history.

(56) References Cited

U.S. PATENT DOCUMENTS

| | | | |
|---|---|---|---|
| 5,691,946 A | 11/1997 | DeBrosse et al. ........... | 365/200 |
| 5,708,291 A | 1/1998 | Bohr et al. .................. | 257/529 |
| 5,831,913 A | 11/1998 | Kirihata ...................... | 365/200 |
| 5,831,914 A | 11/1998 | Kirihata ...................... | 365/200 |
| 5,881,003 A | 3/1999 | Kirihata et al. ............. | 365/200 |
| 5,969,404 A | 10/1999 | Bohr et al. .................. | 257/529 |
| 6,115,310 A | 9/2000 | Netis et al. .................. | 365/210 |
| 6,166,981 A | 12/2000 | Kirihata et al. .......... | 365/225.7 |
| 6,258,700 B1 | 7/2001 | Bohr et al. .................. | 438/467 |
| 6,337,507 B1 | 1/2002 | Bohr et al. .................. | 257/529 |
| 7,254,079 B2 * | 8/2007 | Sumi et al. ............... | 365/225.7 |
| 2002/0000582 A1 | 1/2002 | Kobayashi et al. .......... | 257/226 |
| 2004/0129952 A1 | 7/2004 | Griesmer et al. ............ | 257/202 |
| 2004/0212037 A1 | 10/2004 | Chen et al. .................. | 257/530 |
| 2006/0028777 A1 | 2/2006 | Chung et al. .................. | 361/56 |
| 2006/0087001 A1 | 4/2006 | Kothandaraman et al. ... | 257/529 |
| 2006/0097345 A1 | 5/2006 | Marr ........................... | 257/530 |
| 2006/0158239 A1 | 7/2006 | Bhushan et al. ............. | 327/291 |
| 2006/0158920 A1 | 7/2006 | Sumi et al. .................... | 365/96 |

* cited by examiner

*Primary Examiner*—Son Dinh
*Assistant Examiner*—Nam Nguyen
(74) *Attorney, Agent, or Firm*—Steptoe & Johnson LLP

(57) ABSTRACT

A first transistor is connected in series with one end of a fuse element. A second transistor is connected in series with the other end of the fuse element. A current flows through the fuse element when both the first and second transistors are turned on.

20 Claims, 12 Drawing Sheets

ELECTRIC FUSE CIRCUIT AVAILABLE AS ONE TIME PROGRAMMABLE MEMORY

FIELD OF THE INVENTION

The present invention relates to an electric fuse circuit used as an OTP (One Time Programmable) memory.

BACKGROUND OF THE INVENTION

Electric fuse circuits haven been implemented which program a fuse element by feeding or not feeding a current through the fuse circuit to fuse or not fuse the fuse element. The electric fuse circuit is widely used in semiconductor integrated circuits (LSI) such as trimming program devices for high-frequency semiconductor devices. The conventional electric fuse circuit is made up of electric fuse elements formed of polysilicon and bipolar transistors each feeding a current required to fuse the corresponding electric fuse element. The bipolar transistor is used to feed a large current of about 1 A (Ampere) to fuse the corresponding electric fuse element.

In recent years, in the field of semiconductor integrated circuits, a technique has been developed which forms a silicide layer on a polysilicon layer to reduce the resistance of a gate electrode. Thus, utilizing the technique, an electric fuse element has been developed which has the polysilicon layer and the silicide layer formed over the polysilicon layer such that the resistance is small before the silicide layer is fused and increases when a current is fed to fuse the silicide layer (see U.S. Pat. No. 5,708,291A).

In the electric fuse element, an instantaneous carrying current required to fuse the silicide layer is 10 to 30 mA (milliamperes) for a 130- or 90-nm process generation.

When the electric fuse element utilizing the silicide is used for the trimming program device for the high-frequency semiconductor device or the like, four to eight electric fuse elements are mounted on one chip. Thus, an existing general-purpose tester can be used to fuse all the electric fuse elements at a time.

Furthermore, a metal fuse has been mounted, as a fuse element for redundancy relief, on a RAM in a system LSI such as a DRAM or a SRAM. The electric fuse element utilizing the silicide may be used in place of the metal fuse. However, this technique poses the following problems.

First, 500 to 1,000 fuse elements for RAM redundancy relief are mounted on each chip. Thus, an instantaneous carrying current of about 10 to 30 A is required to fuse the 1,000 electric fuse elements at a time. It is difficult for the existing general-purpose tester to concentrate a current of 10 to 30 A inside an LSI chip, resulting in the need for a dedicated tester. Furthermore, if for example, 1,000 independent electric fuse circuits are mounted in a system LSI and electric fuse elements are sequentially programmed one by one, a large number of control terminals are required. For example, if each circuit has four control terminals, 4,000 control terminals are required but cannot be mounted in the system LSI.

To solve these problems, an electric fuse circuit described below has been proposed (see US 2006/0158920A1). FIG. 11 is a circuit diagram showing the configuration of a conventional electric fuse circuit. As shown in FIG. 11, the electric fuse circuit is composed of a plurality of (n) electric fuse cores 400 and a program shift register block 200 having a plurality of (n) stages.

The electric fuse core 400 has one electric fuse element 401. When a program data signal FBmTi (i=1 to n) is at a High level (hereinafter referred to as an H level), the electric fuse element 401 is set to a fused state while a program enable signal PBmTi (i=1 to n) from the program shift register block 200 is at the H level.

Each stage of the program shift register block 200 generates the program enable signal PmTi (i=1 to n) having a one pulse waveform and sequentially switching to the H level starting at the first stage. The program shift register block 200 inputs the program enable signal PBmTi to each of the first- to nth-stage electric fuse cores 400.

The conventional electric fuse circuit will be described in further detail. As shown in FIG. 11, the electric fuse core 400 comprises the electric fuse element 401, an NMOS transistor 402, and an AND circuit 403 having two input terminals.

One end of the electric fuse element 401 is connected to a power source VDDHE (about 3.3 V), whereas the other end is connected to a drain of the NMOS transistor 402. The NMOS transistor 402 is connected in series with the electric fuse element 401 and has a source connected to a ground terminal. The AND circuit 403 calculates the logical product of the program data signal FBmTi (i=1 to n), input to one of the input terminals, and the program enable signal PBmTi (i=1 to n), input to the other input terminal. The AND circuit 403 then inputs the calculation result, a program signal INmTi (i=1 to n), to a gate of the NMOS transistor 402.

The program shift register block 200 comprises n shift registers (PSR) 201. The n shift registers 201 are serially connected together so that a program control signal FPGI is input to the first stage and so that for the second to nth stages, a signal generated in the stage preceding each stage is input to the latter stage. Furthermore, a program clock signal PCK is input in common to all of the first- to nth-stage shift registers 201. Moreover, the program enable signals PBmTi (i=1 to n) generated by the n shift registers 201 in the program shift register block 200 are input to the first- to nth-stage electric fuse cores 400, respectively.

The specific circuit configuration of the shift register 201 will be described with reference to FIG. 12. FIG. 12 is a circuit diagram showing the configuration of the shift register 201.

As shown in FIG. 12, the shift register 201 comprises two CMOS gate circuits 202 and 205, two inverter circuits 203 and 206, and two tri-state inverter circuits 204 and 207.

The first CMOS gate circuit 202 is made up of a PMOS transistor having a gate to which the program clock signal PCK is input and an NMOS transistor having a gate to which an inversion signal NCK of the program clock signal PCK is input. A program enable transmission signal PAmT (i−1) generated by the (i−1)th shift register is input to the first CMOS gate circuit 202. A program control signal FPGI is input to the first CMOS gate circuit 202 in the first-stage shift register.

A signal from the first CMOS gate circuit 202 is input to the first inverter circuit 203. A signal from the first inverter circuit 203 is input to the first tri-state inverter circuit 204, which then inverts the input signal and inputs the resultant signal to the connection between the first CMOS gate circuit 202 and the first inverter circuit 203. The program clock signal PCK is input to a control terminal of the first tri-state inverter circuit 204 as a control signal (which performs an enabling operation when at the H level).

The second CMOS gate circuit 205 is made up of a PMOS transistor having a gate to which the inversion signal NCK of the program clock signal PCK is input and an NMOS transistor having a gate to which the program clock signal PCK is input. The signal from the first inverter circuit 203 is input to the second CMOS gate circuit 205.

A signal from the second CMOS gate circuit 205 is input to the second inverter circuit 206, which then inverts the input signal to generate a program enable transmission signal PAmTi and also generates the program enable signal PBmTi.

A signal from the second inverter circuit 206 is input to the second tri-state inverter circuit 207, which then inverts the input signal and inputs the resultant signal to the connection between the second CMOS gate circuit 205 and the second inverter circuit 206. Furthermore, the inversion signal NCK of the program clock signal PCK is input to a control terminal of the second tri-state inverter circuit 207 as a control signal (which performs an enabling operation when at the H level).

The operation of the electric fuse circuit configured as described above will be described below with reference to FIG. 13. FIG. 13 is a waveform diagram showing the operation of the conventional electric fuse circuit.

First, the operation of the ith-stage electric fuse core 400 will be described.

For programming, first, the program data signal FBmTi to be input to one of the two input terminals of the AND circuit 403 in the electric fuse core 400 is set to the H level or a Low level (hereinafter referred to as an L level). Specifically, the program data signal FBmTi is set to the H level to set the electric fuse element to a fused state and to the L level to set the electric fuse element to a non-fused state.

The program enable signal PBmTi is input to the other input terminal of the AND circuit 403 in the electric fuse core 400. The electric fuse core 400 can keep the electric fuse element 401 in the fused state only while the program enable signal PBmTi is at the H level. That is, if the program data signal FBmTi is at the H level, the program signal INmTi generated by the AND circuit 403 remains at the H level while the program enable signal PBmTi is at the H level. In this state, the NMOS transistor 402 is on to pass a current through the electric fuse element 401 to set the electric fuse element to the fused state. On the other hand, if the program data signal FBmTi is at the L level, the program signal INmTi remains at the L level even when the program enable signal PBmTi switches to the H level. The NMOS transistor 402 thus remains off to prevent a current from flowing through the electric fuse element 401. This in turn prevents the electric fuse element 401 from entering the fused state (non-fused state).

Now, the operation of the whole electric fuse circuit will be described.

For example, to program the n electric fuse cores 400 so that the cores 400 have data 1, 0, . . . , 1 in this order, first, the signal levels of the program data signals FBmT1, FBmT2, . . . , and FBmTn are set to H, L, . . . , and H in this order.

Then, the program control signal FPGI to be input to the first stage of the program shift register block 200 is raised from the L level to the H level with sufficient setup maintained for the rising edge of the program clock signal PCK. At this time, since the signal PCK is at the L level, the first CMOS gate circuit 202 (see FIG. 12) is on. While the signal PCK is at the L level, the signal FPGI of the H level is input to the first-stage shift register 201.

When the signal PCK rises from the L level to the H level, the first CMOS gate circuit 202 is turned off. The first inverter circuit 203 and first tri-state inverter circuit 204 in the first-stage shift register 201 latch the signal (L level) from the first inverter circuit 203. At the same time, the second CMOS gate circuit 205 is turned on to switch the program enable signal PBmT1 and program enable transmission signal PAmT1 generated by the first-stage shift register 201 to the H level. The signal FPGI is dropped to the L level while the signal PCK is at the H level.

Then, when the signal PCK rises from the H level to the L level, the first CMOS gate circuit 202 is turned on to input the signal FPGI of the L level to the first-stage shift register 201. At the same time, the second CMOS gate circuit 205 is turned off, and the second inverter circuit 206 and second tri-state inverter circuit 207 in the first-stage shift register 201 latch the signal (H level) from the second inverter circuit 206. The latch operation maintains the program enable signal PBmT1 and program enable transmission signal PAmT1 generated by the first-stage shift register 201, at the H level. Furthermore, while the signal PCK is at the L level, the program enable transmission signal PAmT1 of the H level is input to the second-stage shift register 201.

Such an operation of the program shift register block 200 allow the program enable signal PBmTi (i=1 to n) and program enable transmission signal PAmTi (i=1 to n) having a width equal to one period of the signal PCK to be sequentially generated every time the program clock signal PCK repeats a periodic clock operation.

When the program enable signal PBmTi (i=1 to n) input to the AND circuit 403 switches to the H level, the electric fuse core 400 programs the electric fuse element 401. That is, the state of the program signal INmTi (i=1 to n) generated by the AND circuit 403 is sequentially determined at each rising edge of the signal PCK in accordance with the program data signal (FBmT1, FBmT2, . . . , FBmTn)=(H, L, . . . , H).

In the example shown in FIG. 13, when the program enable signal PBmT1 from the first-stage shift register 201 switches to the H level, the program signal INmT1 generated by the AND circuit 403 in the first-stage electric fuse core 400 switches to the H level. During the period corresponding to the pulse width of the signal PCK, the NMOS transistor 402 is on and the first-stage electric fuse element 401 is in the fused state. On the other hand, even when the program enable signal PBmT2 from the second-stage shift register 201 switches to the H level, the program signal INmT2 generated by the AND circuit 403 in the second-stage electric fuse core 400 remains at the L level. The NMOS transistor 402 remains off state and the second-stage electric fuse element 401 is in the non-fused state instead of the fused state. Although not shown in the drawings, as in the case of the second stage, the third- to (n−1)th-stage electric fuse elements 401 are in the non-fused state. Furthermore, when the program enable signal PBmTn from the final-stage shift register 201 switches to the H level, the final-stage electric fuse element 401 is set to the fused state as in the case of the first-stage electric fuse element 401.

The program enable signal PBmTi (i=1 to n) with the one pulse waveform transferred by the program shift register block is thus used to program the electric fuse elements one by one. This enables programming using the existing general-purpose tester. Furthermore, the serial connection of the shift registers allows the circuit to be configured with a small number of terminals. This enables the implementation of an electric fuse circuit that can be mounted in a system LSI.

However, with the conventional electric fuse circuit, if for example, the electric fuse element has a resistance value of 120Ω and a current of about 20 mA is fed to set the electric fuse element to the fused state, a voltage of at least 2.4 V needs to be applied across the electric fuse element. Thus, a 3.3 V_IO NMOS transistor has been used to apply a voltage of about 3 V to the electric fuse element. The conventional electric fuse circuit thus requires a large-sized 3.3 V_IO NMOS transistor having a gate width W of about 60 μm as a switch transistor allowing the feeding of a current required to set the electric fuse element to the fused state. Furthermore, the 3.3 V_IO transistor is also used for an input line to the gate of the NMOS transistor, increasing the area of the electric fuse circuit (the area of the 3.3 V_IO transistor is almost double that of a 1.2 V_logic transistor). In particular, with the possible advancement of fine-pattern processes in the future, the yield of memory cells is expected to decrease to further increase the number of electric fuse elements mounted. Consequently, the area of the electric fuse circuit is expected to be of interest.

Thus, in the conventional electric fuse circuit shown in FIG. 11, the 1.2 V_logic transistor can be used as the NMOS transistor 402. However, in the conventional electric fuse circuit, whenever the gate voltage of the NMOS transistor 402 is '0' V, the same voltage (about 3.3 V) as applied to the top of the electric fuse element 401 is applied to a drain of the NMOS transistor 402, resulting in a potential difference of about 3.3 V between the gate and drain of the NMOS transistor 402. Thus, disadvantageously, TDDB degradation progresses.

On the other hand, in recent years, the use of OTP memories has been prevailing. The use of the OTP memory is likely to spread to various applications, for example, system LSI chips having an ID function for allowing system settings inherent in equipment to be recorded therein or a secure ID function for protecting information, semiconductor chips in each of which a lot number, a chip coordinate position, the results of inspections during a shipping process, and the like are recorded, to provide a chip ID function for enabling tracing such as failure analysis, and IC tags intended for tracking such as distribution management or identification of aircraft luggage.

An OTP memory of a middle capacity of about 1 to 10 kbits is used for the above-described applications. Furthermore, since the above-described chips and tags are mass-produced, the OTP memory for these applications has to be manufactured inexpensively enough to avoid affecting the initial costs of the products, service costs, and the like.

Additionally, to be mixed into a system LSI for an advanced process, the OTP memory must be based on logics similarly to SRAMs or ROMs and successfully developed on time. In spite of the possibility of a rewriting operation, a nonvolatile memory which requires a separate process similarly to flash memories and which is likely to be developed behind the most advanced process by several generations cannot meet the needs utilizing the most advanced process, in view of timing for the introduction, manufacturing costs, and the like.

The electric fuse circuit utilizing the silicide may be used as an OTP memory suitable for the above-described needs. The electric fuse circuit does not require a separate process as used for flash memories because of the use of the fusion of the silicide layer on the polysilicon layer. The electric fuse circuit can also be designed on the basis of logics.

However, as previously described, the configuration of the conventional electric fuse circuit disadvantageously has a great area impact on the chip, significantly affecting manufacturing costs.

DISCLOSURE OF THE INVENTION

In view of the above-described problems, an object of the present invention is to provide an electric fuse circuit that allows a reduction in the area of the circuit by enabling a logic transistor to be used as a switch transistor (first switch transistor) for feeding a current required to set a fuse element to a fused state.

To accomplish the object, the electric fuse circuit according to the present invention includes a first switch transistor, a fuse element, and a second switch transistor connected in series in this order or in the order of the fuse element, the first switch transistor, and the second switch transistor so that a current is passed through the fuse element when both the first and second switch transistors are turned on.

That is, the electric fuse circuit according to the present invention which, during a programming operation, passes or does not pass a current through a fuse element to set the fuse element to one of a fused state and a non-fused state to program the fuse element includes:

the fuse element, a first switch transistor, and a second switch transistor, the first switch transistor being connected in series with one end of the fuse element and the second switch transistor being connected in series with the other end of the fuse element, or the fuse element being connected in series with one end of the first switch transistor and the second switch transistor being connected in series with the other end of the first switch transistor, wherein a current is passed through the fuse element when both the first and second switch transistors are turned on.

With this configuration, with the other end of the second switch transistor connected to a high-voltage power source VDDHE and the other end of one of the first switch transistor and the fuse element connected to ground, turning on both the first and second switch transistors allows the fuse element to be set to the fused state. Furthermore, by turning on the second switch transistor only to program the fuse element, the first switch transistor is prevented from being always subjected to a high voltage. Thus, even if a transistor of a low breakdown voltage (for example, a 1.2 V_logic transistor) is used as the first switch transistor, the progress of the TDDB degradation of the first switch transistor can be delayed.

Furthermore, the electric fuse circuit has a plurality of fuse cores each including the fuse element and the first switch transistor and has the one second switch transistor.

In this configuration, the second switch transistor is shared by the plurality of fuse cores, enabling a reduction in the area of the circuit.

Furthermore, the electric fuse circuit further includes a third switch transistor located in parallel with the second switch transistor, and to program the fuse element, the second switch transistor is turned on to apply a first voltage to the fuse element, and to avoid programming the fuse element, the third switch transistor is turned on to apply a second voltage lower than the first voltage to the fuse element.

With this configuration, the voltage to be applied to the fuse element for programming can be quickly raised to the first voltage (3.3 V_IO voltage level (3.3 V power source VDDHE level; hereinafter referred to as a VDDHE level)). Furthermore, the second voltage is at a 1.2 V_logic voltage level (1.2 V power source VDD level; hereinafter referred to as a VDD level) and is used for a reading operation after the programming has been completed. Then, during the reading operation, a current flows through the fuse element in the same direction as that in which a current flows during the programming operation. This makes it possible to prevent data return ('1'→'0') resulting from movement of silicide after the fusion of the fuse element.

Furthermore, the second and third switch transistors are a P-type transistor and an N-type transistor, respectively, or an N-type transistor and a P-type transistor, respectively.

With this configuration, the second and third switch transistors can be alternately turned on and off using the same signal line without the intervention of a circuit such as an inverter.

Furthermore, the second switch transistor has a thicker gate oxide film than the first switch transistor.

This configuration enables a reduction in the area of the electric fuse circuit. In particular, by using an IO transistor as the second switch transistor and using, as the first switch transistor, a logic transistor having a thinner gate oxide film than the IO transistor, the area of the electric fuse circuit can further be reduced because given the same gate width, the area of the logic transistor is half that of the IO transistor.

Furthermore, the first switch transistor has a thinner gate oxide film than the second switch transistor and is an N-type transistor.

This configuration enables the area of the electric fuse circuit to be reduced because given the same gate width, the area of the N-type transistor is half that of the P-type transistor even if both the N- and P-type transistors are logic transistors.

Furthermore, the second switch transistor has a thicker gate oxide film than the first switch transistor and is an N-type transistor.

This configuration enables the area of the electric fuse circuit to be reduced because given the same gate width, the area of the N-type transistor is half that of the P-type transistor even if both the N- and P-type transistors are IO transistors.

The electric fuse circuit further includes a level shift circuit performing voltage conversion and provided on a signal wiring line connected to a gate of the second switch transistor, and the level shift circuit performs the voltage conversion only to program the fuse element.

This configuration allows the turning-on and -off operation of the second switch transistor to be controlled using an internal signal such as a clock signal. Furthermore, all the circuits preceding the level shift circuit may be composed of logic transistors, enabling a reduction in the area of the electric fuse circuit.

The electric fuse circuit further includes a level shift circuit performing voltage conversion and provided on a signal wiring line connected to a gate of the first switch transistor, and the level shift circuit performs the voltage conversion only to set the fuse element to the fused state.

The level shift circuit interposed in the signal wiring line connected to the gate of the first switch transistor includes only logic transistors.

If the logic transistor is used as the first switch transistor, the gate voltage needs to be set at the VDDHE level in order to feed a current required to set the fuse element to the fused circuit. However, in the above-described configuration, all the circuits preceding the level shift circuit include logic transistors, enabling a reduction in the area of the electric fuse circuit. Moreover, the level shift circuit is composed of only the logic transistors, enabling a further reduction in the area of the electric fuse circuit.

Furthermore, a voltage of a connection between the second switch transistor and the fuse element is used as a high-voltage power source for the level shift circuit interposed in the signal wiring line connected to the gate of the first transistor.

Furthermore, a voltage of a connection between the second switch transistor and the first switch transistor is used as the high-voltage power source for the level shift circuit interposed in the signal wiring line connected to the gate of the first switch transistor.

With this configuration, the level shift circuit does not perform the voltage conversion during non-programming, enabling a reduction in erroneous disconnection resulting from malfunctioning of the level shift circuit. This also makes it possible to provide a mechanism with which the level shift circuit can perform the voltage conversion only during programming while the second switch transistor is on, without the need to add another terminal to the level shift circuit.

The electric fuse circuit further includes a control terminal independent of the power source and a circuit that sets the first switch transistor to one of a program enable state and a disable state depending on a potential of the control terminal.

With this configuration, even if for example, when the electric fuse circuit is powered on, the level shift circuit malfunctions to generate a signal that turns on the first switch transistor, the fuse element can be prevented from being erroneously disconnected by setting the potential of the control terminal at a value that sets the first switch transistor to the disable state.

The electric fuse circuit further includes a control terminal independent of the power source and a circuit that sets the second switch transistor to one of the program enable state and the disable state depending on the potential of the control terminal.

With this configuration, even if for example, when the electric fuse circuit is powered on, the level shift circuit malfunctions to generate a signal that turns on the second switch transistor, the fuse element can be prevented from being erroneously disconnected by setting the potential of the control terminal at a value that sets the second switch transistor to the disable state. Furthermore, by setting the potential of the control terminal at the value that sets the second switch transistor to the disable state after a series of programming operations have been completed, the progress of the TDDB degradation of the first switch transistor can be delayed.

The electric fuse circuit further includes the control terminal independent of the power source, a circuit that sets the first switch transistor to one of the program enable state and the disable state depending on the potential of the control terminal, and a circuit that sets the second switch transistor to one of the program enable state and the disable state depending on the potential of the control terminal.

With this configuration, the same single control terminal can be used to set the first and second switch transistors to one of the program enable state and the disable state. This enables a reduction in the number of terminals.

Furthermore, the electric fuse circuit further includes the control terminal independent of the power source, and a level shift circuit provided on the signal wiring line connected to the gate of the second switch transistor, the level shift circuit using voltage of a signal applied by the control terminal as a high-voltage power source to perform the voltage conversion, and the level shift circuit performs the voltage conversion only to program the fuse element.

This configuration allows the potential of the signal generated by the level shift circuit to be controlled using the terminal independent of the power source. Thus, for example, by setting the potential of the control terminal at a value that turns the second switch transistor off when the electric fuse circuit is powered on, the fuse element can be reliably prevented from being erroneously disconnected. Furthermore, by setting the potential of the control terminal at the value that turns the second switch transistor off after the series of programming operations have been completed, the progress of the TDDB degradation of the first switch transistor can be delayed.

Furthermore, the electric fuse circuit further includes the control terminal independent of the power source, and a level shift circuit provided on the signal wiring line connected to the gate of the first switch transistor, the level shift circuit using the voltage of the signal applied by the control terminal as the high-voltage power source to perform the voltage conversion, and the level shift circuit performs the voltage conversion only to set the fuse element to the fused state.

Furthermore, the electric fuse circuit further includes the control terminal independent of the power source, and the second switch transistor performs turning-on operation and turning-off operation in accordance with a signal applied by the control terminal.

This configuration controls the second switch transistor using only the independent terminal. This eliminates the need for the level shift circuit and the circuits preceding the level shift circuit, enabling a reduction in the area of the electric fuse circuit. Furthermore, when the electric fuse circuit is powered on, the second switch transistor can be reliably set to the disable state, making it possible to reliably prevent the fuse element from being erroneously disconnected. Additionally, by setting the second switch transistor to the disable state after the series of programming operations have been completed, the progress of the TDDB degradation of the first switch transistor can be delayed.

Furthermore, the electric fuse circuit further includes the control terminal independent of the power source, the signal applied by the control terminal controls the gate of the second switch transistor, and the second switch transistor performs the turning-on operation and turning-off operation in accordance with the signal applied by the control terminal.

With this configuration, if for example, the electric fuse circuit is located on a system LSI chip and when a voltage drop in the power source wiring precludes the current capability of the second switch transistor from being sufficiently achieved, the current capability can be enhanced by increasing the voltage level of the signal input through the control terminal. The fuse element can thus be stably programmed.

Alternatively, if the electric fuse circuit is used as a fuse element for RAM redundancy relief, even when the result of a RAM inspection with the power source voltage reduced indicates the presence of a defect, the current capability can be enhanced by increasing the voltage level of the signal input through the control terminal as described above. A program for switching to an acceptable RAM can thus be stably executed.

The electric fuse circuit has a function of, after all the fuse elements are programmed, receiving an program end signal to turn off the second switch transistor.

With this configuration, once the series of programming operations are completed, the second switch transistor is turned off to enable the progress of the TDDB degradation of the first switch transistor to be delayed.

As described above, the present invention allows the logic transistor to be used as a switch transistor (first switch transistor) for feeding a current required to set the fuse element to the fused state. This enables a reduction in the area of the electric fuse circuit, providing a more inexpensive OTP memory.

The electric fuse circuit according to the present invention allows a reduction in the area of the circuit by enabling the logic transistor to be used as the switch transistor for feeding the current required to set the fuse element to the fused state. The present invention is thus useful if the electric fuse circuit is used as a fuse element for RAM redundancy relief. Furthermore, the electric fuse circuit according to the present invention is used as an OTP memory utilized in, for example, a system LSI chip having an ID function for allowing system settings inherent in equipment to be recorded therein or a secure ID function for protecting information, a semiconductor chip in which a lot number, a chip coordinate position, the results of inspections during a shipping process, and the like are recorded, to provide a chip ID function for enabling tracing such as failure analysis, or an IC tag intended for tracking such as distribution management or identification of aircraft luggage.

DESCRIPTION OF THE EMBODIMENTS

Embodiment 1

An electric fuse circuit according to Embodiment 1 of the present invention will be described below with reference to the drawings. During a programming operation, the electric fuse circuit programs a fuse element by passing or not passing a current through the fuse element to set the fuse element to one of a fused state and a non-fused state.

Figure 1:
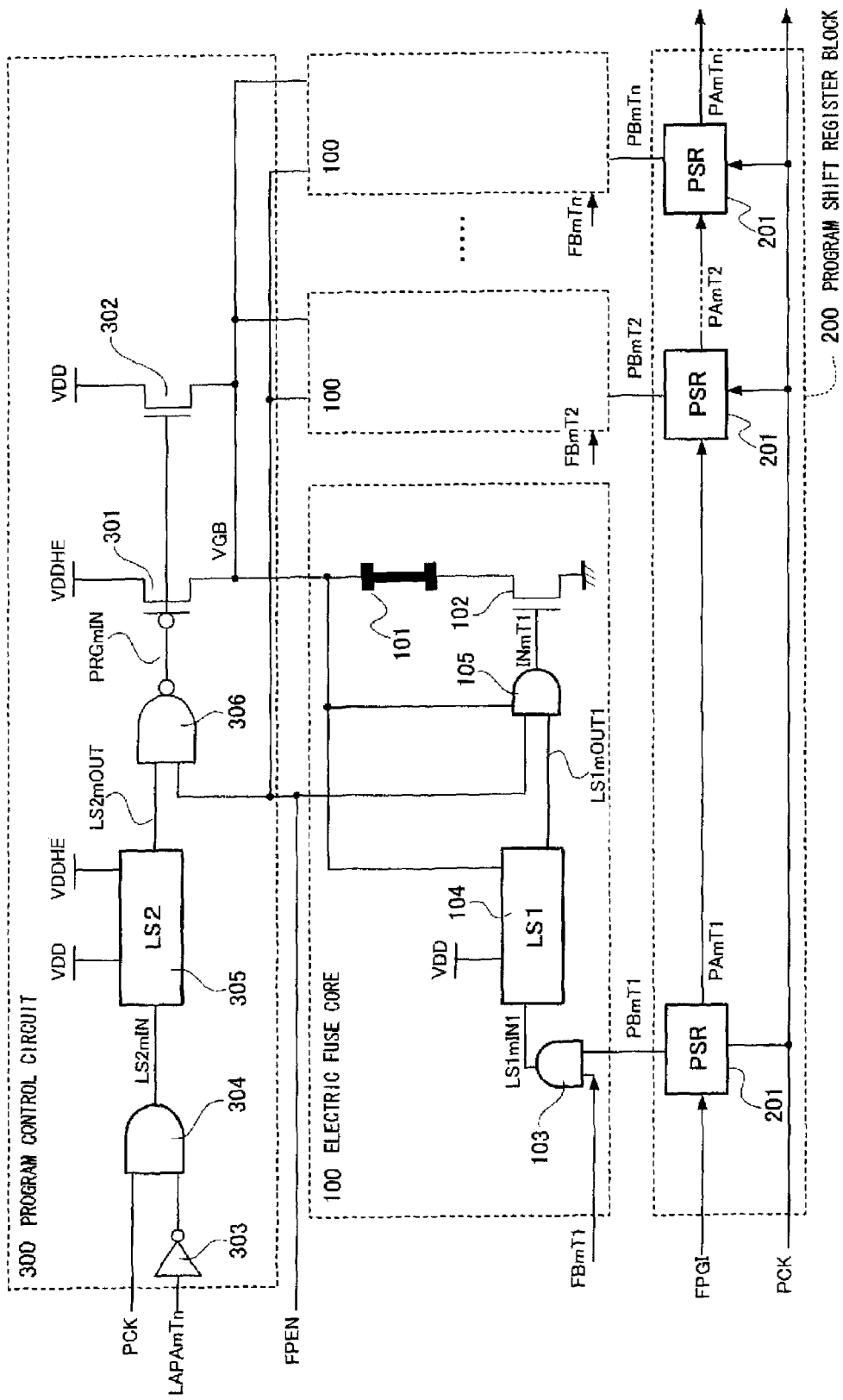
FIG. 1 is a circuit diagram showing the configuration of an electric fuse circuit according to Embodiment 1 of the present invention.
Figure 11:
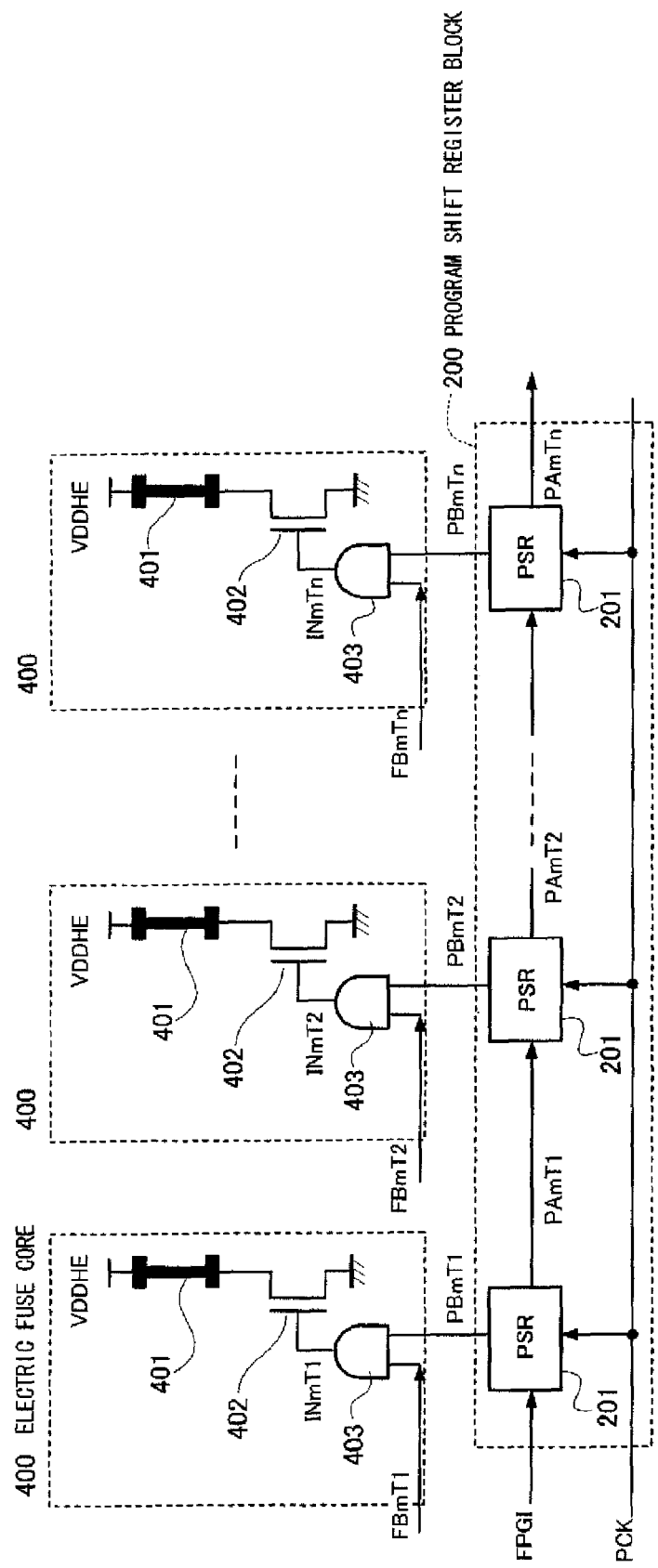
FIG. 11 is a circuit diagram showing the configuration of a conventional electric fuse circuit.
Figure 12:
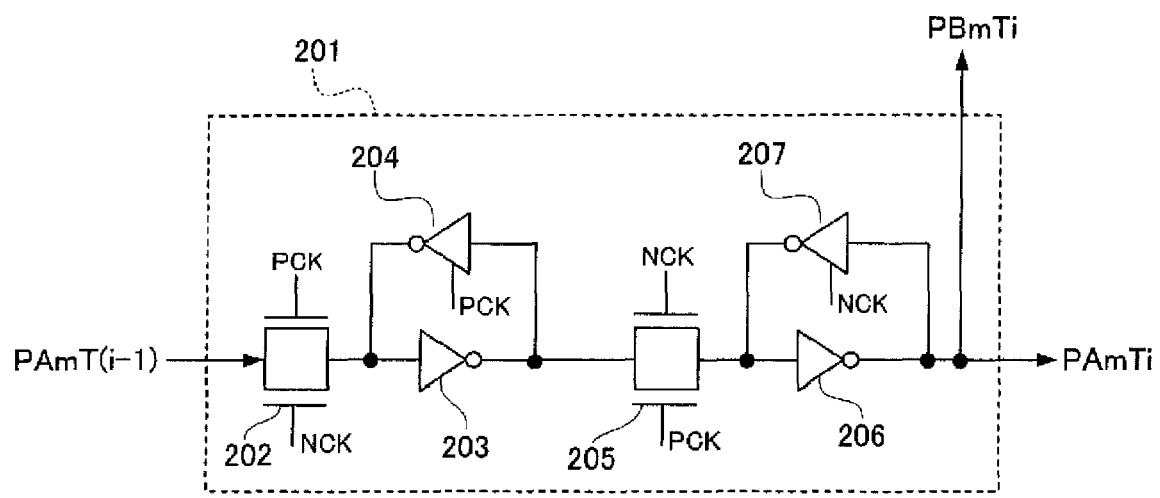
FIG. 12 is a circuit diagram showing the configurations of shift registers in the conventional electric fuse circuit and the electric fuse circuits according to Embodiments 1 to 4 of the present invention.

FIG. 1 is a circuit diagram showing the configuration of the electric fuse circuit according to Embodiment 1. The same members as described with reference to FIGS. 11 and 12 are denoted by the same reference numerals and will thus not be described. As shown in FIG. 1, the electric fuse circuit is made up of a plurality of (n) electric fuse cores 100, a program shift register block 200 having a plurality of (n) stages, and a program control circuit 300. The program shift register block 200 is the same as that described with reference to FIGS. 11 and 12 and will thus not be described.

First, the electric fuse core 100 will be described in detail.

As shown in FIG. 1, the electric fuse core 100 comprises an electric fuse element 101, a 1.2V_logic NMOS transistor 102 that is a first switch transistor, two AND circuits 103 and 105, and a level shift circuit (LSI) 104.

The electric fuse element 101 includes a polysilicon layer and a silicide layer formed on the polysilicon layer. The electric fuse element 101 offers a small resistance while the silicide layer is not fused and offers a large resistance when the silicide layer is fused. One end of the electric fuse element 101 is connected to a drain of the NMOS transistor 102. The NMOS transistor 102 is connected in series with the electric fuse element 101 and has a source connected to a ground terminal. A signal VGB from the program control circuit 300 is applied to the other end of the electric fuse element 101.

The AND circuit 103 is composed of a 1.2 V_logic transistor and uses a 1.2 V power source VDD as a power source. The AND circuit 103 calculates the logical product of a program data signal FPmTi (i=1 to n) input to one of two input terminals and a program enable signal PBmTi (i=1 to n) input to the other input terminal. The AND circuit 103 then inputs the calculation result, a signal LS1$m$INi (i=1 to n), to the level shift circuit 104. The program data signal FBmTi is set to an H level (VDD level) in order to set the electric fuse element 101 to the fused state. The program data signal FBmTi is set to an L level in order to set the electric fuse element 101 to the non-fused state. Thus, to set the electric fuse element 101 to the fused state, the signal LS1$m$INi, generated by the AND circuit 103, is at the H level (VDD level) while the program enable signal PBmTi is at the H level (VDD level). On the other hand, to avoid setting the electric fuse element 101 to the fused state, the signal LS1$m$INi is at the L level regardless of the program enable signal PBmTi.

The level shift circuit 104, to which the signal LS1$m$INi from the AND circuit 103 is input, converts the VDD level into the voltage level of the signal VGB using the power source VDD and the signal VGB as a power source. Thus, to set the electric fuse element 101 to the fused state, a signal LS1$m$OUTi (i=1 to n) generated by the level shift circuit 104 is at the same voltage level as that of the signal VGB while the program enable signal PBmTi is at the H level. To avoid setting the electric fuse element 101 to the fused state, the signal LS1$m$OUTi (i=1 to n) is at the L level.

The AND circuit 105 is composed of a 3.3 V_IO transistor and uses the signal VGB as a power source. The AND circuit 105 calculates the logical product of the signal LS1$m$OUTi from the level shift circuit 104 input to one of two input terminals and a fuse program enable signal FPEN input to the other input terminal. The AND circuit 105 then inputs the calculation result, a program signal INmTi (i=1 to n), to a gate of the NMOS transistor 102.

Here, the fuse program enable signal FPEN is input through a control terminal (not shown) independent of a power source VDDHE for the electric fuse circuit. The fuse program enable signal FPEN is set at a VDDHE level for a programming operation and fixed to the L level for a non-programming operation. Furthermore, as described below, the signal VGB changes between the VDD level and the VDDHE level in conjunction with periodic clock operations of a program clock signal PCK. Thus, to set the electric fuse element 101 to the fused state, the program signal INmTi is at the VDDHE level while the program enable signal PBmTi is at the H level and while the signal VGB is at the VDDHE level.

As described above, the electric fuse core 100 comprises the level shift circuit 104, which performs voltage conversion, in a signal wiring line connected to the gate of the NMOS transistor 102. Only when the electric fuse element 101 is to be set to the fused state, the level shift circuit 104 performs the voltage conversion to generate the signal LS1$m$OUTi for the voltage level of the signal VGB. During a programming operation, since the fuse program enable signal FPEN is set to the H level (VDDHE level), the AND circuit 105 generates the program signal INmTi of the VDDHE level while the signal LS1$m$OUTi is at the VDDHE level (during programming). The AND circuit 105 applies the resultant signal to the gate of the NMOS transistor 102 to turn on the NMOS transistor 102. Even with a 1.2 V_logic NMOS transistor having a general gate width W of 60 μm, thus setting the gate voltage to the VDDHE level makes it possible to feed a current required to set the electric fuse element 101 to the fused state while the signal VGB, applied to the top of the electric fuse element 101, is at the VDDHE level.

Now, the program control circuit 300 will be described.

The program control circuit 300 has a built-in 3.3 V_IO transistor connected in series with each electric fuse element 101. The IO transistor inputs, to all the electric fuse circuits 101, the signal VGB, which switches to the VDDHE level every time the program clock signal PCK rises from the L level to the H level.

The program control circuit 300 will be described in further detail.

As shown in FIG. 1, the program control circuit 300 comprises a 3.3 V_IO PMOS transistor 301 that is a second switch transistor, a 3.3 V_IO NMOS transistor 302 that is a third switch transistor, an inverter circuit 303, an AND circuit 304, a level shift circuit (LS2) 305, and a NAND circuit 306.

The PMOS transistor 301 has a source connected to the power source VDDHE, a gate to which a program enable switching signal PRGmIN is input, and a drain connected to each electric fuse element 101. The NMOS transistor 302 located in parallel with the PMOS transistor 301 has a drain connected to the power source VDD, a gate to which the program enable switching signal PRGmIN is input, and a source connected to each electric fuse element 101. The PMOS transistor 301 and the NMOS transistor 302 generate the signal VGB.

Thus, the program enable switching signal PRGmIN is input to the gates of both the PMOS transistor 301 and the NMOS transistor 302. Switching the signal PRGmIN to the H level (VDDHE level) turns off the PMOS transistor 301, turns on the NMOS transistor 302, and sets the signal VGB to the VDD level. On the other hand, switching the signal PRGmIN to the L level turns on the PMOS transistor 301, turns off the NMOS transistor 302, and sets the signal VGB to the VDDHE level. The signal VGB is input to all the electric fuse cores 100 and applied to the input terminal of each electric fuse element 101. Thus, while the PMOS transistor 301 is on (during programming), the voltage of the VDDHE level (first voltage) is input to each electric fuse element 101. While the NMOS transistor 302 is on (during non-programming), the voltage of the VDD level (second voltage) is input to each electric fuse element 101.

A signal LAPAmTn is input to the inverter circuit 303. The signal LAPAmTn is generated by latching a falling edge of a signal (program enable transmission signal) PAmTn generated by a final-stage shift register 201 in the program shift register block 200.

The AND circuit 304 is composed of a 1.2 V_logic transistor and uses the power source VDD as a power source. The AND circuit 304 calculates the logical product of a signal from the inverter circuit 303 and the program clock signal PCK. The AND circuit 105 then inputs the calculation result, a signal LS2$m$IN, to the level shift circuit 305. The level shift circuit 305, to which the signal LS2$m$IN from the AND circuit 304 is input, uses the power source VDD and the power source VDDHE as a power source to convert the VDD level into the VDDHE level.

The NAND circuit 306 is composed of a 3.3 V_IO transistor and uses the power source VDDHE as a power source. The NAND circuit 306 calculates the negative logical product of a signal LS2mOUT from the level shift circuit 305 and the fuse program enable signal FPEN. The NAND circuit 306 then inputs the calculation result, the program enable switching signal PRGmIN to the gates of both the PMOS transistor 301 and the NMOS transistor 302.

The above-described configuration allows the program control circuit 300 to internally generate the program enable switching signal PRGmIN, which performs a clock operation in conjunction with the periodic clock operation of the program clock signal PCK. That is, every time the program clock signal PCK rises from the L level to the H level, the program enable switching signal PRGmTN changes to the L level. The signal VGB switches to the VDDHE level. Every time the program clock signal PCK falls from the H level to the L level, the program enable switching signal PRGmIN changes to the H level (VDDHE level). The signal VGB switches to the VDD level.

Thus, in synchronism with the clock signal, the program control circuit 300 alternately turns on the PMOS transistor 301 and the NMOS transistor 302 to switch the signal VGB between the VDDHE level and the VDD level.

Every time the program clock signal PCK repeats the periodic clock operation, the program shift register block 200 sequentially generates the one-pulse signal (program enable signal PBmTi (i=1 to n) having a width equal to one period of the signal PCK and inputs the signal to each of the first- to nth-stage electric fuse cores 100.

Thus, as previously described, if the program data signal FBmTi is at the H level, the electric fuse core 100 can apply the program signal INmTi of the VDDHE level to the gate of the NMOS transistor 102 to set the electric fuse element 101 to the fused state while the program enable signal PBmTi is at the H level and while the signal VGB is at the VDDHE level.

Thus, the electric fuse circuit is configured so as to pass a current through the electric fuse element 101 when both the NMOS transistor 102 and the PMOS transistor 301 are turned on.

Now, a detailed description will be given of the level shift circuit 104, built into the electric fuse core 100.

Figure 2:
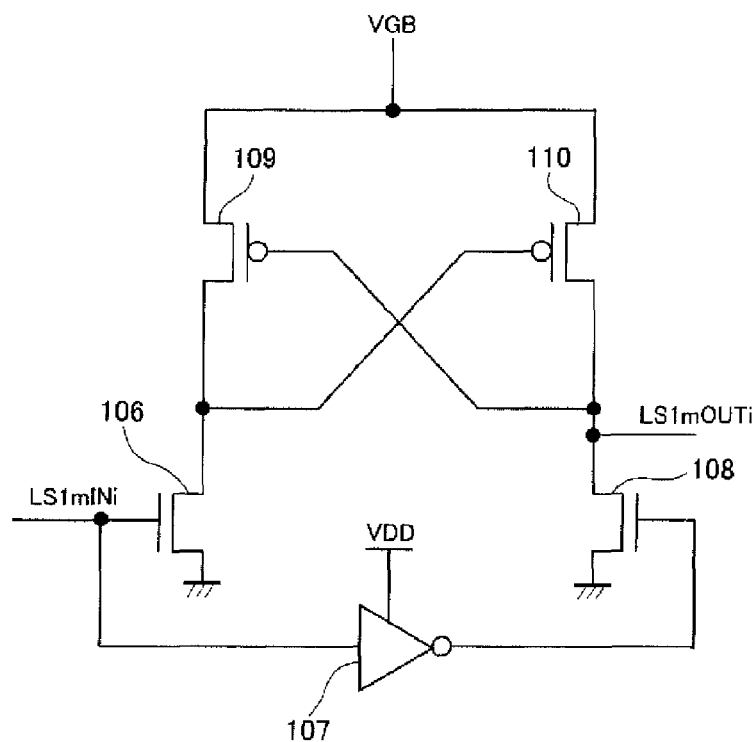
FIG. 2 is a circuit diagram showing the configuration of a level shift circuit provided in an electric fuse core in the electric fuse circuit according to Embodiment 1.

FIG. 2 is a circuit diagram showing the configuration of the level shift circuit 104. The level shift circuit 104 is composed of a first NMOS transistor 106, a second NMOS transistor 108, an inverter circuit 107, a first PMOS transistor 109, and a second PMOS transistor 110.

The first NMOS transistor 106 is a 1.2 V_logic transistor and has a source connected to a ground terminal and a gate to which the signal LS1mINi from the AND circuit 103 is input. The inverter circuit 107 is composed of a logic transistor and uses the power source VDD as a power source. The LS1mINi from the AND circuit 103 is input to the inverter circuit 107. The second NMOS transistor 108 is a 1.2 V_logic transistor and has a source connected to a ground terminal and a gate to which a signal from the inverter circuit 107 is input. A drain of the second NMOS transistor 108 constitutes an output terminal of the level shift circuit 104.

The first PMOS transistor 109 is a 1.2 V_logic transistor and has a gate connected to the drain of the second NMOS transistor 108 (the output terminal of the level shift circuit 104), a drain connected to a drain of the first NMOS transistor 106, and a source to which the signal VGB is input.

The second PMOS transistor 110 is a 1.2 V_logic transistor and has a gate connected to the drain of the first PMOS transistor 109, a drain connected to the drain of the second NMOS transistor 108 (the output terminal of the level shift circuit 104), and a source to which the signal VGB is input.

In the above-described configuration, if the signal LS1mINi, which is the input signal, is at the L level, the first NMOS transistor 106 is off, and the second NMOS transistor 108 is on. Furthermore, the first PMOS transistor 109 is on, and the second PMOS transistor 110 is off. Moreover, the signal LS1mOUTi from the level shift circuit 104, input to the AND circuit 105, is at the L level. If the input signal LS1mINi is at the H level (VDD level), the first NMOS transistor 106 is on, and the second NMOS transistor 108 is off. Furthermore, the first PMOS transistor 109 is off, and the second PMOS transistor 110 is on. Moreover, the signal LS1mOUTi is at the same voltage level as that of the signal VGB.

Embodiment 1 has the level shift circuit 104 as described above. All the circuits preceding the level shift circuit 104 can be composed of logic transistors, enabling a reduction in the area of the electric fuse circuit. Moreover, the level shift circuit 104 is composed of a logic transistor, enabling a further reduction in the area of the electric fuse circuit.

Furthermore, as shown in FIG. 2, the signal VGB is used as a high-voltage power source for the level shift circuit 104 to allow the VDDHE-level voltage and the VDD-level voltage to be alternately supplied to the level shift circuit 104. This makes it possible to delay the progress of TDDB degradation of the logic transistors constituting the level shift circuit 104. The level shift circuit 104 is allowed to convert the voltage into the VDDHE level only during programming while the PMOS transistor 301 is on and does not perform the voltage conversion during non-programming. This enables a reduction in the possibility of disconnection resulting from malfunctioning of the level shift circuit 104.

Furthermore, as shown in FIG. 1, the level shift circuit 104 is connected to the connection between the PMOS transistor 301 and the electric fuse element 101 to input the signal VGB to the connection as a high-voltage power source. No additional terminals need to be provided in the level shift circuit 104 in order to implement a mechanism allowing the level shift circuit 104 to perform the voltage conversion only during programming.

Now, the level shift circuit 305, built into the program control circuit 300, will be described in further detail.

Figure 3:
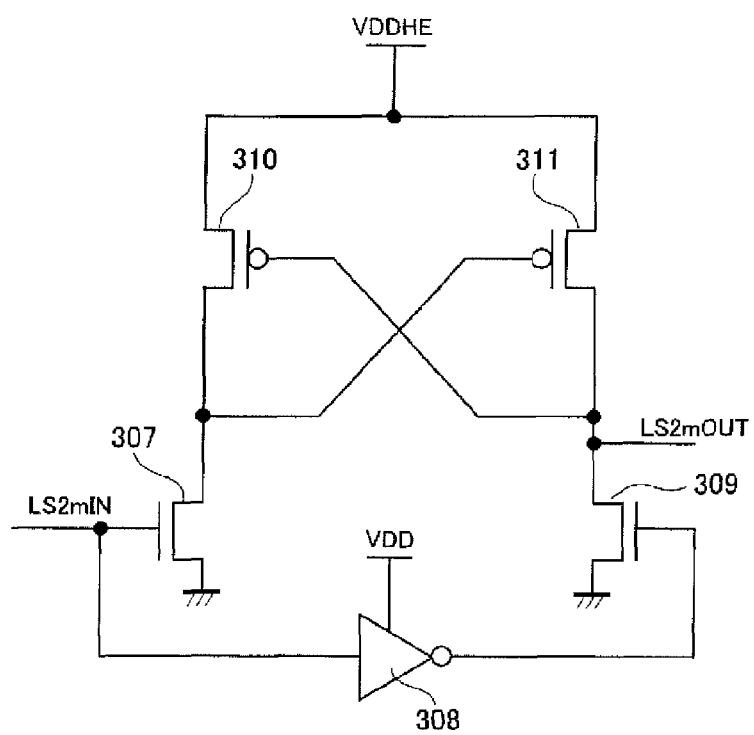
FIG. 3 is a circuit diagram showing the configuration of a level shift circuit provided in a program control circuit in the electric fuse circuit according to Embodiment 1.

FIG. 3 is a circuit diagram showing the configuration of the level shift circuit 305. The level shift circuit 305 is made up of a first NMOS transistor 307, a second NMOS transistor 309, an inverter circuit 308 composed of a 1.2 V_logic transistor, a first PMOS transistor 310, and a second PMOS transistor 311.

The members constituting the level shift circuit 305 have the same connection relationship as that in the level shift circuit 104. The level shift circuit 305 is different from the level shift circuit 104 in that the first and second NMOS transistors and the first and second PMOS transistors are all of the IO type and in that the power source VDDHE is connected to the sources of the first and second PMOS transistors.

Consequently, as is the case with the above-described level shift circuit 104, if the output LS2mIN from the AND circuit 304, which is the input signal, is at the L level, the first NMOS transistor 307 is off, and the second NMOS transistor 309 is on. Furthermore, the first PMOS transistor 310 is on, and the second PMOS transistor 311 is off. Moreover, the signal LS2mOUT, input to the NAND circuit 306 by the level shift circuit 305, is at the L level. If the input signal LS2mIN is at the H level (VDD level), the first NMOS transistor 307 is on, and the second NMOS transistor 309 is off. Furthermore, the first PMOS transistor 310 is off, and the second PMOS transistor 311 is on. Moreover, the signal LS2mOUT is at the VDDHE level.

As described above, in Embodiment 1, the level shift circuit 305, performing the voltage conversion, is inserted in the signal wiring line connected to the gates of the PMOS transistor 301 and NMOS transistor 302 on the program control circuit 300. The provision of the level shift circuit 305 enables the turning-on and -off operations of the PMOS transistor 301 and NMOS transistor 302 to be controlled using the clock signal without the need to provide additional external terminals. Furthermore, all the circuits preceding the level shift circuit 305 may be composed of logic transistors, enabling a reduction in the area of the electric fuse circuit.

Figure 4:
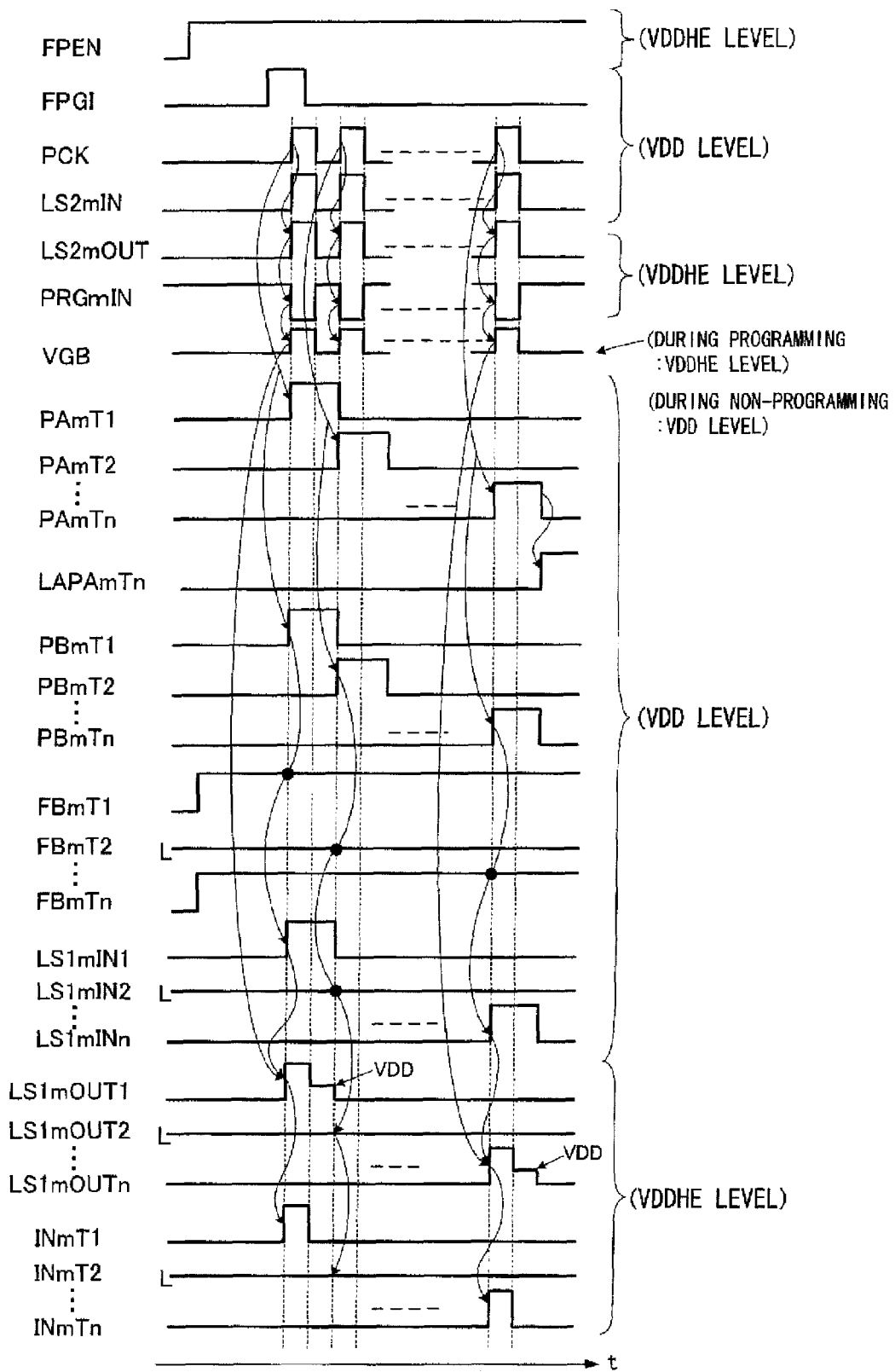
FIG. 4 is a waveform diagram showing the operation of the electric fuse circuit according to Embodiment 1.

The operation of the electric fuse circuit configured as described above will be described below with reference to FIG. 4. FIG. 4 is a waveform diagram of the electric fuse circuit.

As shown in FIG. 4, before the programming operation is started, the fuse program enable signal FPEN has been fixed to the L level. Thus, before the programming operation is started, the signal INmTi, generated by the AND circuit 105 in the electric fuse core 100, has been fixed to the L level, and the NMOS transistor 102 has been off (disable state). Furthermore, the signal PRGmIN, generated by the NAND circuit 306 in the program control circuit 300, has been fixed to the H level, and the PMOS transistor 301 has been off (disable state). The signal VGB, generated by the program control circuit 300, is fixed to the VDD level.

As described above, the fuse program enable signal FPEN sets the NMOS transistor 102 and the PMOS transistor 301 to the disable state for non-programming. Thus, when for example, the electric fuse circuit is powered on, if the signal LS1mOUTi, generated by the level shift circuit 104 in the electric fuse core 100, and the signal LS2mOUT, generated by the level shift circuit 305 in the program control circuit 300, switch to the H level (VDDHE level) (for example, when the electric fuse circuit is powered on, if the power source VDDHE and then the power source VDD are applied to the level shift circuit 305 in the program control circuit 300, the operation of turning on the second NMOS transistor 309 is delayed, switching the signal LS2mOUT to the VDDHE level instead of the L level), the electric fuse element 101 can be prevented from being erroneously disconnected by fixing the fuse program enable signal FPEN, input through the control terminal independent of the power source, to the L level to turn off the NMOS transistor 102 and the PMOS transistor 301 (disable state) as described above.

To start the programming operation, the fuse program enable signal FPEN is changed from the L level to the H level to input a voltage of about 3.3 V to the circuit independently of the power source VDDHE. This switches, to a through state, the signal LS1mOUTi, input to the other input terminal of the AND circuit 105 in the electric fuse core 100, and the signal LS2mOUT, input to the other input terminal of the NAND circuit 306 in the program control circuit 300, to allow the programming operation to be started. Thus, for the programming operation, the fuse program enable signal FPEN sets the NMOS transistor 102 and the PMOS transistor 301 to the program enable state.

As described above, the electric fuse element can be prevented from being erroneously disconnected owing to, for example, malfunctioning of the level shift circuit upon power-on, by providing the terminal independent of the power source, setting the terminal to the L level before the programming operation starts and forcibly turning off the NMOS transistor 102 in the electric fuse core 100 and the PMOS transistor 301 in the program control circuit 300 (disable state).

Furthermore, the same control terminal is used to set the NMOS transistor 102 in the electric fuse core 100 and the PMOS transistor 301 in the program control circuit 300 to the program enable state or disable state. This enables a reduction in the number of required terminals.

During an interval when the program clock PCK is at the L level, the signal LS2mIN, generated by the AND circuit 304 in the program control circuit 300, is at the L level (the signal LAPAmTn is initially at the L level). The signal LS2mOUT, generated by the level shift circuit 305, is also at the L level. Thus, the signal PRGmIN, generated by the NAND circuit 306, is at the H level (VDDHE level). The PMOS transistor 301 is off, and the NMOS transistor 302 is on. The signal VGB is at the VDD level (about 1.2 V).

During an interval when the program clock PCK is at the H level, the signal LS2mIN, generated by the AND circuit 304 in the program control circuit 300, is at the H level (VDD level). The signal LS2mOUT, generated by the level shift circuit 305, is also at the H level (VDDHE level). The H level (VDDHE level) of the signal LS2mOUT and the H level (VDDHE level) of the signal FPEN switch the signal PRGmIN, generated by the NAND circuit 306, to the L level. The PMOS transistor 301 is turned on, and the NMOS transistor 302 is turned off. The signal VGB switches to the VDDHE level (about 3.3 V).

Therefore, as the program clock signal PCK repeats the periodic clock operation, the signal VGB is set to the VDD level during the interval when the signal PCK is at the L level, and is set to the VDDHE level during the interval when the signal PCK is at the H level.

In Embodiment 1, to reduce the area of the electric fuse circuit, the whole electric fuse core 100 except for the AND circuit 105 is composed of 1.2 V_logic transistors with a low breakdown voltage. If a high voltage at the VDDHE level is always applied to the electric fuse core 100, the 1.2 V_logic transistors may be broken owing to the progress of the TDDB degradation. Specifically, breakage may occur in the NMOS transistor 102 with a low breakdown voltage, connected in series with the electric fuse element 101, and the low-breakdown-voltage transistors constituting the level shift circuit 104. Thus, in Embodiment 1, the program control circuit 300 generates the signal VGB alternately feeding the VDDHE-level voltage and the VDD-level voltage in conjunction with the periodic clock operation of the program clock signal PCK. The program control circuit 300 then supplies the signal VGB to the level shift circuit 104 as a power source and applies the signal VGB to the electric fuse element 101. This configuration makes it possible to delay the progress of TDDB degradation of the 1.2 V_logic transistors constituting the electric fuse core 100.

Now, the operation of the electric fuse core 100 will be described taking the ith stage as an example.

For programming, first, the program data signal FBmTi, input to one of the input terminals of the AND circuit 103, is set to the H or L level. Specifically, the program data signal FBmTi is set to the H level to set the ith-stage electric fuse element to the fused state. The program data signal FBmTi is set to the L level to avoid setting the ith-stage electric fuse element to the fused state.

The program enable signal PBmTi is input to the other input terminal of the AND circuit 103. The electric fuse core 100 programs the electric fuse element 101 only while the program enable signal PBmTi is at the H level.

That is, the shift register 201 in the program shift register block 200 is controlled by the 1.2 V_logic power source VDD. If the program data signal FBmTi is at the H level (VDD level), while the program enable signal PBmTi is at the H level, the signal LS1mINi, generated by the AND circuit 103, is at the H level (VDD level). The VDD-level signal is input to the level shift circuit 104. The level shift circuit 104 converts the VDD level into VDDHE while the signal VGB is at the VDDHE level. Thus, if the program data signal FBmTi is at the H level (VDD level), while the program data signal FBmTi is at the H level and the signal VGB is at the VDDHE level, the signal LS1mINi of the VDD level input to the level shift circuit 104 is converted into the signal LS1mOUTi of the VDDHE level. The AND circuit 105 to which the signal LS1mOUTi of the VDDHE level and the fuse program enable signal FPEN of the VDDHE level are input applies the signal INmTi of the VDDHE level (H level) to the gate of the NMOS transistor 102, which is thus turned on. At this time, since the signal VGB is at the VDDHE level, a current required to set the electric fuse element 101 to the fused state flows to set the electric fuse element 101 to the fused state.

When the program data signal FBmTi is at the L level, even if the program enable signal PBmTi is at the H level, the signal LS1mINi, generated by the AND circuit 103, is at the L level, and the signal LS1mOUT1, generated by the level shift circuit 104, is also at the L level. Thus, the signal INmTi, generated by the AND circuit 105, is at the L level, and the NMOS transistor 102 remains on. No current flows through the electric fuse element 101, which is thus not set to the fused state.

Now, the operation of the whole electric fuse circuit will be described below. The operation of the program shift register block 200 is as described with reference to FIGS. 11 to 13 and will not be described below.

For example, when the n electric fuse cores 101 are to be programmed as (1, 0, . . . , 1), first, the signal levels of the program data signals FBmT1, FBmT2, . . . , FBmTn are set to (H, L, . . . , H).

The fuse program enable signal FPEN is then changed to the H level. The program control signal FPGI, input to the first-stage shift register 201 in the program shift register block 200, is then raised from the L level to the H level, with sufficient setup maintained for a rising edge of the program clock signal PCK. While the signal PCK is at the L level, the signal FPGI of the H level is input to the first-stage shift register 201.

As the program clock signal PCK repeats the periodic clock operation, the program shift register block 200 sequentially generates the program enable signal PBmTi (i=1 to n) having a width equal to one period of the signal PCK and the program enable transmission signal PAmTi (i=1 to n).

When the program enable signal PBmTi (i=1 to n), input to the AND circuit 103 in the electric fuse core 100, switches to the H level, the electric fuse core 100 programs the electric fuse element 101. That is, the state of the signal LS1mINi (i=1 to n), generated by the AND circuit 103, is sequentially determined for each rising edge of the signal PCK in accordance with the program data signal (FBmT1, FBmT2, . . . , FBmTn)=(H, L, . . . , H).

In the example shown in FIG. 4, while the program enable signal PBmT1 from the first-stage shift register 201 is at the H level (VDD level), the signal LS1mINi generated by the AND circuit 103 in the first-stage electric fuse core 100 is at the H level (VDD level). The signal LS1mOUTi having the same voltage level as that of the signal VGB as a result of conversion by the level shift circuit 104 is input to the AND circuit 105. While the P2K is at the H level, the program signal INmT1 is at the H level, and the first-stage electric fuse element 101 is set to the fused state.

On the other hand, even though the program enable signal PBmT2 from the second-stage shift register 201 switches to the H level, the signal LS1mIN2 generated by the AND circuit 103 in the second-stage electric fuse core 100 remains at the L level. The signal LS1mOUT2 ad the program signal INmT2, generated by the level shift circuit 104 and the AND circuit 105, respectively, switch to the L level. Consequently, the NMOS transistor 102 remains off, and the second-stage electric fuse element 101 is set to the non-fused state.

Although not shown in the drawings, like the second-stage electric fuse element, the third- to (n−1)th-stage electric fuse elements 101 are set to the non-fused state. When the program enable signal PBmTn from the final-stage shift register 201 switches to the H level (VDD level), the final-stage electric fuse element 101, like the first-stage electric fuse element, is set to the fused state.

Once programming of the n-stage electric fuse element 101 is finished, the signal PAmTn generated by the final-stage shift register 201 in the program shift register block 200 changes from the H level to the L level. The signal LAPAmTn latched to the H level (VDD level) in response to a rising edge generated at the moment of the change to the L level is input to the program control circuit 300. The signal generated by the AND circuit 303 in the program control circuit 300 changes to the L level. The signal LS2mOUT, generated by the level shift circuit 305, changes to the L level regardless of the operation of the program clock signal PCK. Once the programming operation is finished, the electric fuse circuit is inhibited from being programmed.

When programming of all the electric fuse elements 101 is thus finished, the signal LAPAmTn (program end signal) of the H level is input to the program control circuit 300 to turn off the PMOS transistor (second switch transistor) 301 regardless of the operation of the program clock signal PCK. This makes it possible to delay the progress of TDDB degradation of the transistors constituting the electric fuse core 100.

Figure 13:
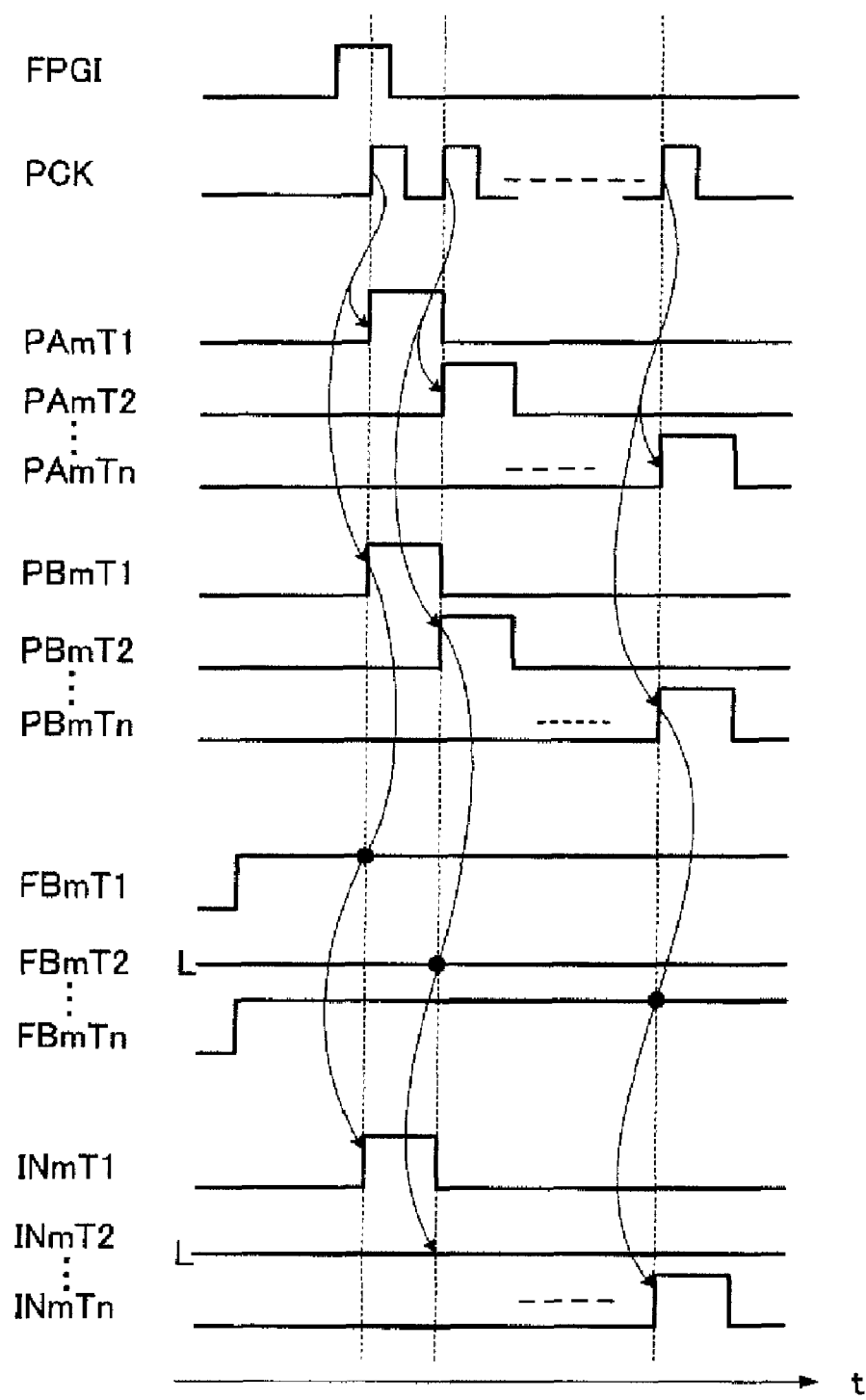
FIG. 13 is a waveform diagram showing the operation of the conventional electric fuse circuit.

As described above, Embodiment 1 allows the electric fuse element to be programmed using specifications similar to those of the conventional electric fuse circuit, described with reference to FIGS. 11 to 13 (however, the specifications of Embodiment 1 are different from those of the conventional electric fuse circuit in that the input terminal for the signal FPEN is additionally provided in order to prevent the electric fuse element from being erroneously disconnected). In the description of Embodiment 1, the electric fuse circuit has the plurality of electric fuse cores. However, the present invention is applicable to a single electric fuse core.

Furthermore, Embodiment 1 prevents a high voltage from being always applied to the first switch transistor, which feeds a current required to set the electric fuse element 101 to the fused state. Thus, even if a transistor of a low breakdown voltage (for example, a 1.2-V logic transistor) is used as the first switch transistor, the progress of the TDDB degradation can be delayed.

Furthermore, in Embodiment 1, the whole electric fuse core 100 except for the AND circuit 105 is composed of 1.2 V_logic transistors. Embodiment 1 makes it possible to reduce the area of the electric fuse core (a bit cell section) to about half of the area of the electric fuse core 100 composed only of 3.3 V__10 transistors (the logic transistor has a thinner gate oxide film than the IO transistor, and for the same gate width, the area of the logic transistor is half that of the IO transistor).

Embodiment 1 uses the N-type transistor (NMOS transistor) as the first switch transistor. However, a P-type transistor may be used. However, for the same gate width, the area of the NMOS transistor is half that of the PMOS transistor even when both transistors are logic transistors. Accordingly, using the NMOS transistor as the first switch transistor enables a reduction in area.

In Embodiment 1, the program control circuit 300 is shared by the plurality of electric fuse cores 100 (electric fuse elements 101). This enables a reduction in the area of the electric fuse circuit.

Furthermore, in Embodiment 1, the 3.3 V_IO NMOS transistor 302 is located in parallel with the 3.3 VIO PMOS transistor 301. One end of the NMOS transistor 302 is connected to the 1.2-V power source VDD, having a lower voltage level than the 3.3-V power source VDDHE. The PMOS transistor 301 and the NMOS transistor 302 are alternately turned on to generate the signal VGB switching alternately between the VDDHE level and the VDD level. This configuration can reduce the time required to raise the voltage level to VDDHE compared to a configuration generating a signal switching between, for example, the VDDHE level and a GND level. Moreover, the NMOS transistor 302, which switches the signal VGB to the VDD level, can be used for a reading operation. In this case, the direction of a current flowing through the fuse element during the reading operation can be set the same as that during the programming operation. This makes it possible to prevent data return ('1'→'0') caused by movement of the fused silicide.

Furthermore, in Embodiment 1, the second switch transistor, which switches the signal VGB to the VDDHE level, is composed of a PMOS transistor (P-type transistor), and the third switch transistor, which switches the signal VGB to the VDD level, is composed of an NMOS transistor (N-type transistor). This allows the turning-on and -off operation of the second and third switch transistors to be controlled using the same signal line without the need for the intervention of a circuit such as an inverter. The signal VGB can thus be generated by the simple configuration.

Furthermore, in Embodiment 1, the NMOS transistor (first switch transistor) 102 is composed of a logic transistor having a thinner gate oxide film than the PMOS transistor (second switch transistor) 301, composed of an IO transistor. However, the first switch transistor may be composed of a transistor having a smaller gate width than the PMOS transistor 301 or a transistor having a smaller gate length than the PMOS transistor 301. This enables a reduction in the area of the electric fuse core.

Embodiment 2

Figure 5:
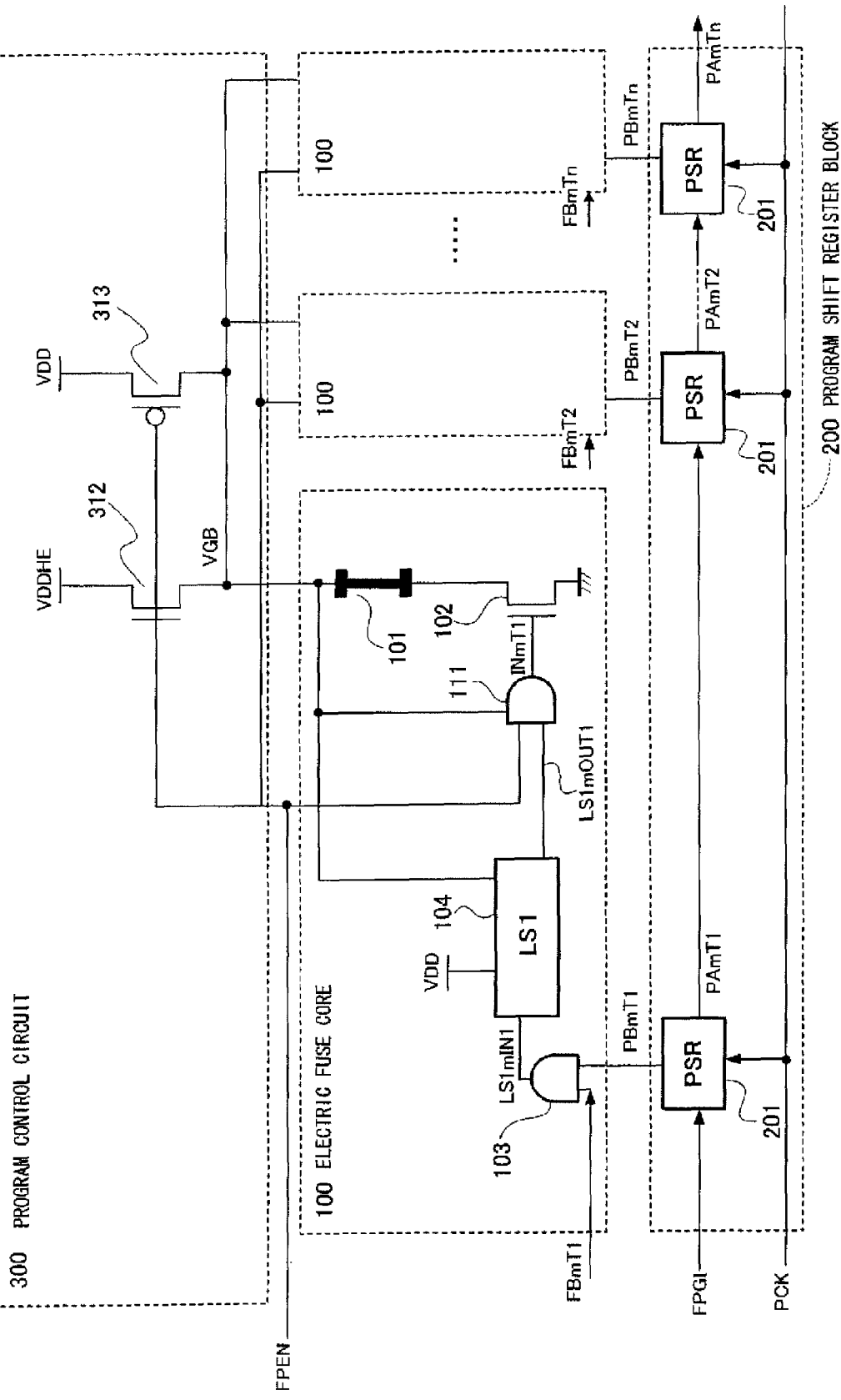
FIG. 5 is a circuit diagram showing the configuration of an electric fuse circuit according to Embodiment 2.

An electric fuse circuit according to Embodiment 2 of the present invention will be specifically described with reference to the drawings. FIG. 5 is a circuit diagram showing the configuration of the electric fuse circuit according to Embodiment 2. The same members as those described with reference to FIGS. 1 to 3, 11, and 12 are denoted by the same reference numerals and will thus not be described.

As is the case with Embodiment 1, the electric fuse circuit is made up of a plurality of (n) electric fuse cores 100, a program shift register block 200 having a plurality of (n) steps, and a program control circuit 300. The program shift register block 200 is the same as that described with reference to FIGS. 11 and 12 and will thus not be described. Furthermore, the electric fuse core 100 is the same as that described with reference to FIGS. 1 and 2 except that an AND circuit 111 corresponding to the AND circuit 105, shown in FIG. 1, uses the signal VGB as a power source. The AND circuit 111 thus uses, as a power source, the signal VGB, which switches between the VDDHE level and the VDD level, and can thus be composed of logic transistors. This is effective for reducing the area of the electric fuse core 100.

The program control circuit 300 will be described below.

The program control circuit 300 according to Embodiment 2 differs from that according to Embodiment 1, described above, in that the signal FPEN, input through the control terminal independent of the power source, is used to directly control the turning-on and -off operations of the second switch transistor, which applies the VDDHE-level voltage to the electric fuse element 101, and the third switch transistor, which applies the VDD-level voltage to the electric fuse element 101.

In Embodiment 2, during the programming operation, the signal performing the clock operation in synchronism with the program clock signal PCK is used as the fuse program enable signal FPEN. Specifically, the fuse program enable signal FPEN is at the H level (VDDHE level) during the interval when the signal PCK is at the H level. The fuse program enable signal FPEN is at the L level during the interval when the signal PCK is at the L level.

The program control circuit 300 will be described in further detail.

As shown in FIG. 5, the program control circuit 300 comprises a 3.3 V_TO NMOS transistor 312 that is a second switch transistor and a 3.3 V_IO PMOS transistor 313 that is a third switch transistor.

The NMOS transistor 312 has a drain connected to the 3.3-V power source VDDHE, a gate to which the fuse program enable signal FPEN is input, and a source connected to the electric fuse elements 101. The PMOS transistor 313, located in parallel with the NMOS transistor 312, has a source connected to the 1.2-V power source VDD, a gate to which the fuse program enable signal FPEN is input, and a drain connected to the electric fuse elements 101. The NMOS transistor 312 and the PMOS transistor 313 generate the signal VGB.

Thus, the fuse program enable signal FPEN, switching between the H level (VDDHE level) and the L level, is input to the gates of both the NMOS transistor 312 and the PMOS transistor 313. Switching the signal FPEN to the H level turns on the NMOS transistor 312, turns off the PMOS transistor 313, and switches the signal VGB to the VDDHE level. On the other hand, switching the signal FPEN to the L level turns off the NMOS transistor 312, turns on the PMOS transistor 313, and switches the signal VGB to the VDD level. The signal VGB is input to all the electric fuse cores 100 and applied to the electric fuse elements 101. Consequently, while the NMOS transistor 312 is on (during programming), the VDDHE-level voltage (first voltage) is applied to the electric fuse elements 101. While the PMOS transistor 313 is on (during non-programming), the VDD-level voltage (second voltage) is applied to the electric fuse elements 101.

With the above-described configuration, every time the fuse program enable signal FPEN, performing the clock operation in conjunction with the periodic clock operation of the program clock signal PCK, rises from the L level to the H level, the signal VGB switches to the VDDHE level. Furthermore, every time the fuse program enable signal FPEN falls from the H level to the L level, the signal VGB switches to the VDD level.

The program control circuit 300 thus alternately turns on the NMOS transistor 312 and the PMOS transistor 313 in synchronism with the clock signal to switch the signal VGB between the VDDHE level and the VDD level.

Figure 6:
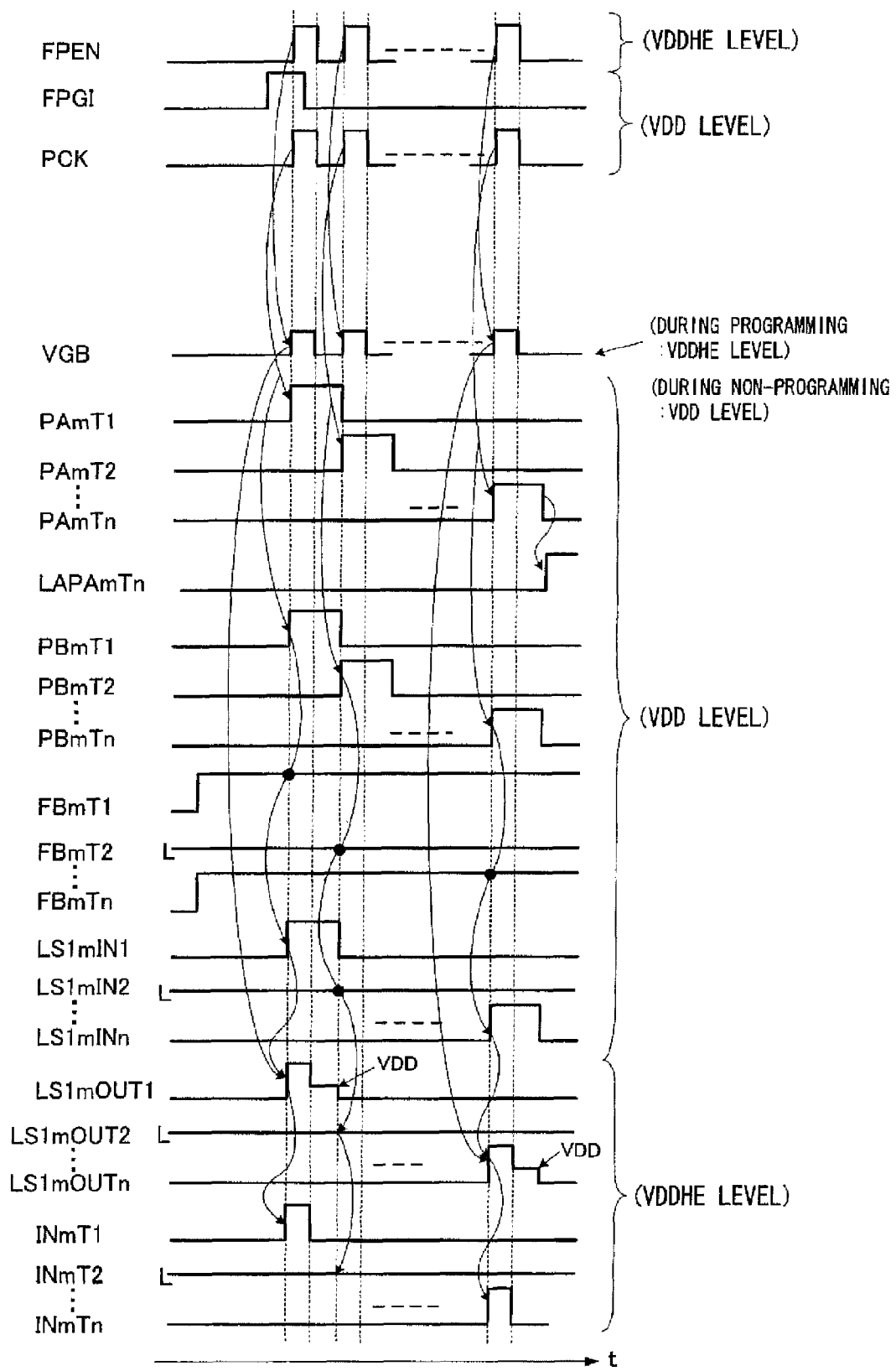
FIG. 6 is a waveform diagram showing the operation of the electric fuse circuit according to Embodiment 2.

The operation of the electric fuse circuit configured as described above will be described below with reference to FIG. 6. FIG. 6 is a waveform diagram showing the operation of the electric fuse circuit. As shown in FIG. 6, before the programming operation is started, the fuse program enable signal FPEN has been fixed to the L level as is the case with Embodiment 1. Thus, before the programming operation is started, the signal INmTi, generated by the AND circuit 105 in the electric fuse core 100, has been fixed to the L level to turn off the NMOS transistor 102 (disable state). The NMOS transistor 312 in the program control circuit 300 is also turned off (disable state), with the signal VGB fixed to the VDD level.

On the other hand, during the programming operation, the fuse program enable signal FPEN performs the clock operation in synchronism with the program clock signal PCK to switch between the H level (VDDHE level) and the L level. This sets the NMOS transistors 102 and 312 to the program enable state.

Thus, as is the case with Embodiment 1, during the non-programming operation, the NMOS transistors 102 and 312 are set to the disable state. This makes it possible to prevent the electric fuse element from being erroneously disconnected, for example, owing to malfunctioning of the level shift circuit when the electric fuse circuit is powered on. Furthermore, the same control terminal is used to set both the NMOS transistors 102 and 312 to one of the program enable state and the disable state. This enables a reduction in the number of terminals required.

During the interval when the fuse program enable signal FPEN is at the L level (the interval in which the program clock signal PCK is at the L level), the NMOS transistor 312 is off, the PMOS transistor 313 is on, and the signal VGB is at the VDD level (about 1.2 V). During the interval when the fuse program enable signal FPEN is at the H level (the interval in which the program clock signal PCK is at the H level), the NMOS transistor 312 is on, the PMOS transistor 313 is off, and the signal VGB is at the VDDHE level (about 3.3 V).

Thus, as the fuse program enable signal FPEN repeats the periodic clock operation, the signal VGB is at the VDD level during the interval when the signal FPEN is at the L level. The signal VGB is at the VDDHE level during the interval when the signal FPEN is at the H level. That is, the signal VGB, generated by the program control circuit 300, has the same waveform as that of the signal VGB described in Embodiment 1.

Now, the operation of the electric fuse core 100 will be described.

The electric fuse core 100 differs from that described above in Embodiment 1 in that the fuse program enable signal FPEN, input to one of the input terminals of the AND circuit 10C, performs the clock operation. However, when the signal LS1mOUTi, generated by the level shift circuit 104, is at the VDDHE level, the fuse program enable signal FPEN is also at the VDDRE level. Consequently, the signal INmT1, generated by the AND circuit 105, has the same waveform as that in Embodiment 1.

Thus, as is the case with Embodiment 17 if the program data signal FBmTi is at the H level, while the program enable signal PBmTi is at the H level and the signal VGB is at the VDDHE level, the signal INmTi generated by the AND circuit 105 is at the VDDHE level (H level) and is applied to the gate of the NMOS transistor 102, which is thus turned on. At this time, the signal VGB is at the VDDHE level, so that a current required to set the electric fuse element 101 to the fused state flows to set the electric fuse element 101 to the fused state. If the program data signal FBmTi is at the L level, the electric fuse element 101 is not set to the fused state.

As described above, the signal VGB, generated by the program control circuit 300, has the same waveform as that of the signal VGB, described above in Embodiment 1. The electric fuse core 100 thus operates similarly to the electric fuse core described above in Embodiment 1. Therefore, the operation of the whole electric fuse circuit is similar to that described above in Embodiment 1.

When the programming of the nth electric fuse element 101 is finished and the signal PAmTn generated by the final-stage shift register 201 of the program shift register block 200 switches from the H level to the L level, fixing the fuse program enable signal FPEN to the L level allows the electric fuse circuit to be set to the program disable state simultaneously with the end of the programming operation.

As described above, the electric fuse circuit according to Embodiment 2 has the same input terminal configuration as that of the electric fuse circuit described above in Embodiment 1 to provide functions equivalent to those of the latter. Moreover, the NMOS transistor (second switch transistor) 312 is turned on and off in accordance with the fuse program enable signal FPEN, input through the control terminal independent of the power source. Thus, compared to Embodiment 1, the present embodiment eliminates the need to provide the program control circuit 300 with the level shift circuit and the control circuits preceding the level shift circuit. This enables a reduction in the area of the electric fuse circuit.

Furthermore, the gate of the NMOS transistor (second switch transistor) 312 is controlled by the fuse program enable signal FPEN from the control terminal independent of the power source. Thus, if for example, the electric fuse circuit is located on a system LSI chip and when a voltage drop in the power source wiring precludes the current capability of the NMOS transistor 312 from being sufficiently achieved, the current capability can be enhanced by increasing the voltage level of the signal FPEN, input through the control terminal which is not shown. The electric fuse element 101 can thus be stably programmed.

Alternatively, if the electric fuse circuit is used as a fuse element for RAM redundancy relief, even when the result of a RAM inspection with the power source voltage reduced indicates the presence of a defect, the current capability can be enhanced by increasing the voltage level of the signal FPEN input through the control terminal as described above. A program for switching to an acceptable RAM can thus be stably executed.

Furthermore, in Embodiment 2, the second switch transistor, which switches the signal VGB to the VDDHE level, is composed of an NMOS transistor (N-type transistor). The third switch transistor, which switches the signal VGB to the VDD level, is composed of a PMOS transistor (P-type transistor). This allows the turning-on and -off operation of the second and third switch transistors to be controlled using the same signal line without the need for the intervention of a circuit such as an inverter. The signal VGB can thus be generated by the simple configuration.

Embodiment 3

Figure 7:
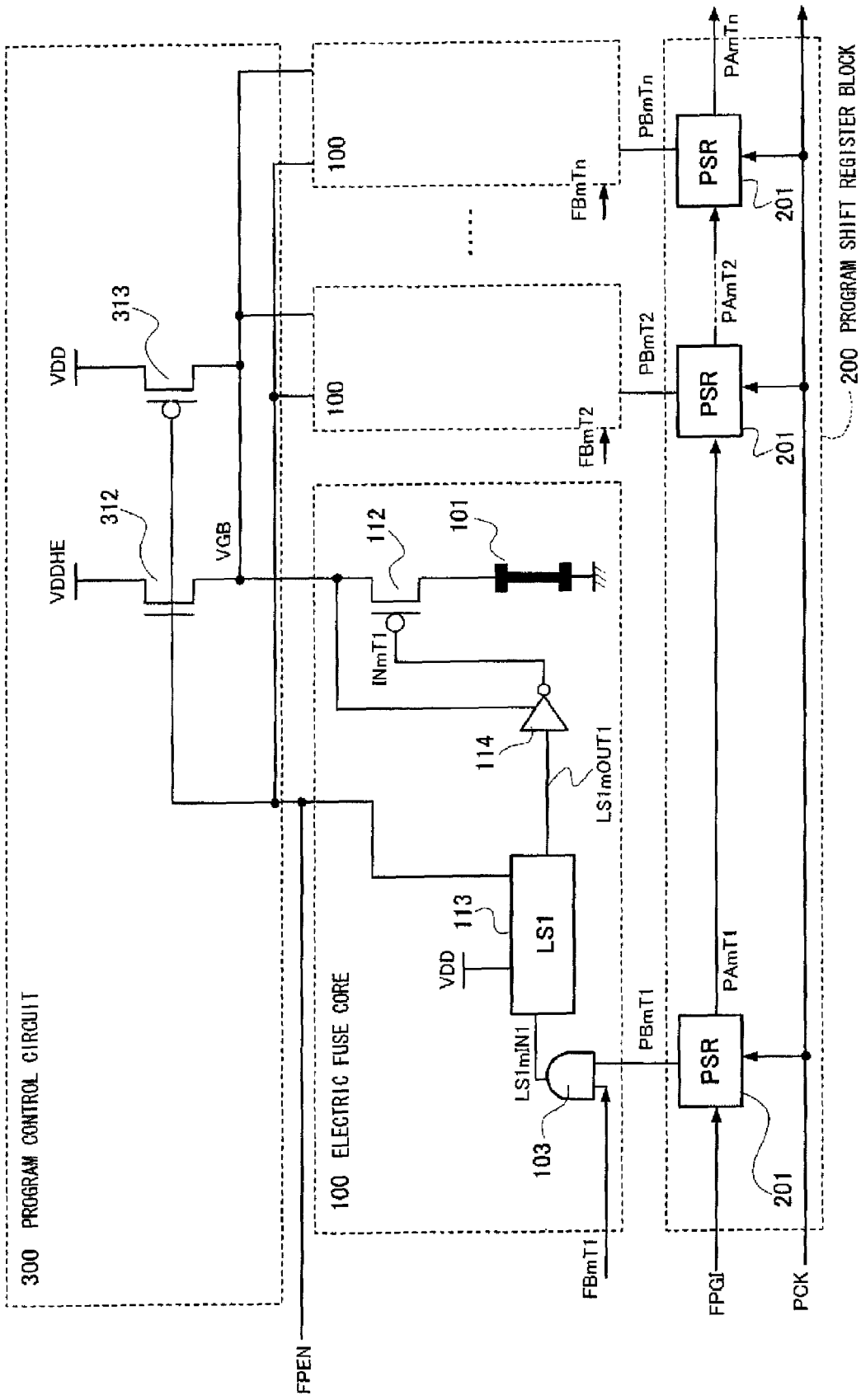
FIG. 7 is a circuit diagram showing the configuration of an electric fuse circuit according to Embodiment 3.

An electric fuse circuit according to Embodiment 3 of the present invention will be specifically described with reference to the drawings. FIG. 7 is a circuit diagram showing the configuration of the electric fuse circuit according to Embodiment 3. The same members as those described with reference to FIGS. 1 to 3, 5, 11, and 12 are denoted by the same reference numerals and will thus not be described.

As is the case with Embodiment 1, the electric fuse circuit is made up of a plurality of (n) electric fuse cores 100, a program shift register block 200 having a plurality of (n) steps, and a program control circuit 300. The program shift register block 200 is the same as that described with reference to FIGS. 11 and 12 and will thus not be described. Furthermore, the program control circuit 300 is the same as that described above in Embodiment 2 and will thus not be described below.

In Embodiment 3, as in the case of Embodiment 2, the fuse program enable signal FPEN switches between the H level (VDDHE level) and the L level in synchronism with the program clock signal PCK during a programming operation.

The electric fuse circuit according to Embodiment 3 differs from Embodiments 1 and 2 in that the 1.2 V_logic PMOS transistor 112 is used as the first switch transistor feeding a current required to set the electric fuse element 101 to the fused state, in that the electric fuse element 101, the PMOS transistor 112, and the NMOS transistor 312 that is the second switch transistor are connected in series in this order, and in that the fuse program enable signal FPEN is used as a high-voltage power source for the level shift circuit 113 in the electric fuse core 100.

The electric fuse core 100 will be described below.

As shown in FIG. 7, the electric fuse core 100 comprises an electric fuse element 101, a PMOS transistor 112, an AND circuit 103, a level shift circuit 113, and an inverter circuit 114.

One end of the electric fuse element 101 is connected to a drain of the PMOS transistor 112. The other end of the electric fuse element 101 is connected to the ground terminal. A source of the PMOS transistor 112 is connected to a source of the NMOS transistor 312 and to a drain of the PMOS transistor (third transistor) 313. The signal VGB from the program control circuit 300 is applied to the source of the PMOS transistor 112. Furthermore, the signal INmTi from the inverter circuit 114 is input to a gate of the PMOS transistor 112.

The level shift circuit 113, to which the signal LS1mINi from the AND circuit 103 is input, uses the power source VDD and the fuse program enable signal FPEN as a power source to convert the VDD level into the voltage level of the signal FPEN. The configuration of the level shift circuit 113 is similar to that of the level shift circuit 305 in the program control circuit 300, described above in Embodiment 1; the level shift circuit 113 is made up of an IO transistor and a logic transistor (see FIG. 3). As described above, the signal FPEN operates in synchronism with the program clock signal PCK to switch between the H level (VDDHE level) and the L level. Thus, if the program data signal FBmTi is at the H level, while the program enable signal PBmTi is at the H level and the signal FPEN is at the VDDHE level (the program clock signal PCK is at the H level), the signal LS1mOUTi, generated by the level shift circuit 113, is at the VDDHE level.

By thus using the fuse program enable signal FPEN to control the high-voltage power source for the level shift circuit 113 to, for example, fix the fuse program enable signal FPEN to the L level when the electric fuse circuit is powered on, the electric fuse element can be reliably prevented from being erroneously disconnected owing to malfunctioning of the level shift circuit 113.

The level shift circuit 113 may be composed only of logic transistors similarly to the level shift circuit 104 in the electric fuse core 100, described above in Embodiment 1 (see FIG. 2).

Furthermore, the signal VGB may be used as a high-voltage power source for the level shift circuit 113 as is the case with the level shift circuit 104, described above in Embodiment 1. In this case, the signal VGB from the connection between the PMOS transistor 112 and the NMOS transistor 312 is input to the level shift circuit 113.

The inverter circuit 114 uses the signal VGB as a power source and is constructed using 1.2 V_logic transistors. The signal LS1mOUTi from the level shift circuit 113 is input to the inverter circuit 114. The inverter circuit 114 generates and inputs the program signal INmTi to the gate of the PMOS transistor 112. If the program data signal FBmTi is at the H level, while the program enable signal PBmTi is at the H level and the signal FPEN is at the VDDHE level, the signal FBmTi, generated by the inverter circuit 114, is at the L level (GND level).

Figure 8:
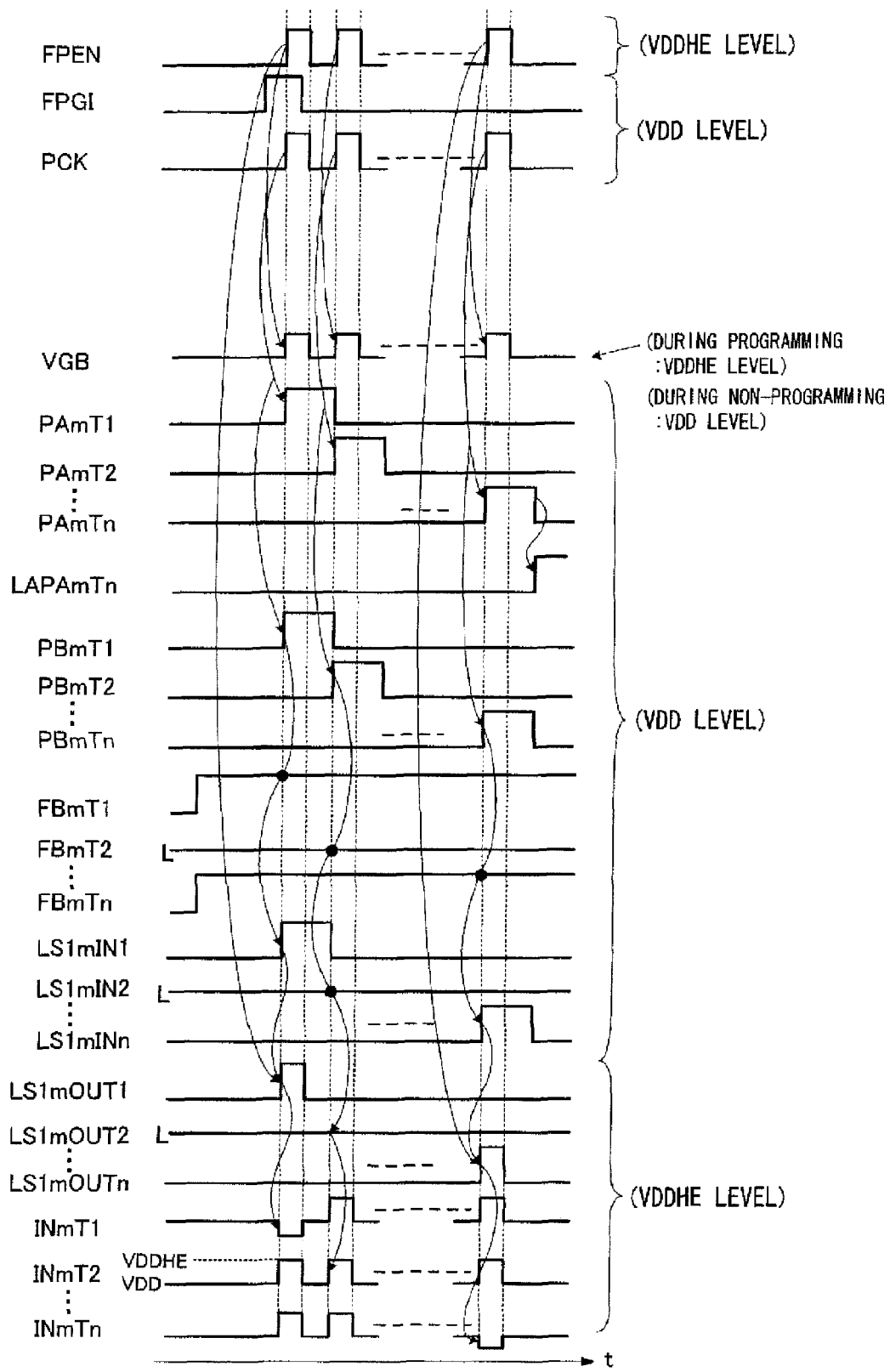
FIG. 8 is a waveform diagram showing the operation of the electric fuse circuit according to Embodiment 3.

The operation of the electric fuse circuit configured as described above will be described below with reference to FIG. 8. FIG. 8 is a waveform diagram showing the operation of the electric fuse circuit. The operation of the program shift register block 200 in Embodiment 3 is as described with reference to FIGS. 11 to 13 and will thus not be described below. Furthermore, the operation of the program control circuit 300 is the same as that of the program control circuit 300 in Embodiment 2 and will thus not be described below.

As shown in FIG. 8, before the programming operation is started, the fuse program enable signal FPEN has been fixed to the L level. Thus, before the programming operation is started, the signal LS1OUTi, generated by the level shift circuit 113 in the electric fuse core 100, has been fixed to the L level to turn off the PMOS transistor 112 (disable state). The NMOS transistor 312 in the program control circuit 300 is also turned off (disable state), with the signal VGB fixed to the VDD level.

On the other hand, during the programming operation, the fuse program enable signal FPEN switches between the H level (VDDHE level) and the L level in synchronism with the program clock signal PCK. This sets the PMOS transistor 112 and the NMOS transistor 312 to the program enable state.

Thus, during the non-programming operation, the fuse program enable signal FPEN sets the PMOS transistor 112 and the NMOS transistor 312 to the disable state. This makes it possible to prevent the electric fuse element from being erroneously disconnected, for example, owing to malfunctioning of the level shift circuit when the electric fuse circuit is powered on. Furthermore, the same control terminal is used to set both the PMOS transistor 112 and the NMOS transistor 312 to one of the program enable state and the disable state. This enables a reduction in the number of terminals required.

Now, the operation of the electric fuse core 100 will be described.

As is the case with Embodiment 1, if the program data signal FBmTi is at the H level (VDD level), while the program enable signal PBmTi is at the H level, the signal LS1mINi, generated by the AND circuit 103, is at the H level (VDD level). If the program data signal FBmTi is at the L level, the signal LS1mINi is at the L level.

While the signal FPEN is at the VDDHE level, the level shift circuit 113 converts the VDD level into VDDHE. Thus, if the program data signal FBmTi is at the H level (VDD level), while the program enable signal PBmTi is at the H level and the signal FPEN is at the VDDHE level, the signal LS1mINi of the VDD level, input to the level shift circuit 113, is converted into the signal LS1mOUTi of the VDDHE level. If the program data signal FBmTi is at the L level, the signal LS1mOUTi is at the L level.

While the signal LS1mOUTi is at the H level (VDDHE level), the signal INmTi, generated by the inverter circuit 114, is at the L level (GND level). While the signal LS1mOUTi is at the L level, the signal INmTi has the same waveform as that of the signal VGB.

Consequently, if the program data signal FBmTi is at the H level (VDD level), while the program enable signal PBmTi is at the H level and the signal FPEN is at the VDDHE level, the signal INmTi generated by the inverter circuit 114 is at the L level and is applied to the gate of the PMOS transistor 112, which is thus turned on. Then, a current required to set the electric fuse element 101 to the fused state flows to set the electric fuse element 101 to the fused state. If the program data signal FBmTi is at the L level, the signal INmTi generated by the inverter circuit 114 has the same waveform as that of the signal VGB. The PMOS transistor 112 thus remains on, preventing a current from flowing through the electric fuse element 101, which is thus not set to the fused state.

As described above, the electric fuse circuit according to Embodiment 3 differs from Embodiments 1 and 2 in the signal INmTi, which controls the gate of the first switch transistor (PMOS transistor 112). However, the operation of the first switch transistor is the same as that described above in Embodiments 1 and 2. Therefore, the operation of the whole electric fuse circuit is similar to Embodiments 1 and 2.

Embodiment 4

Figure 9:
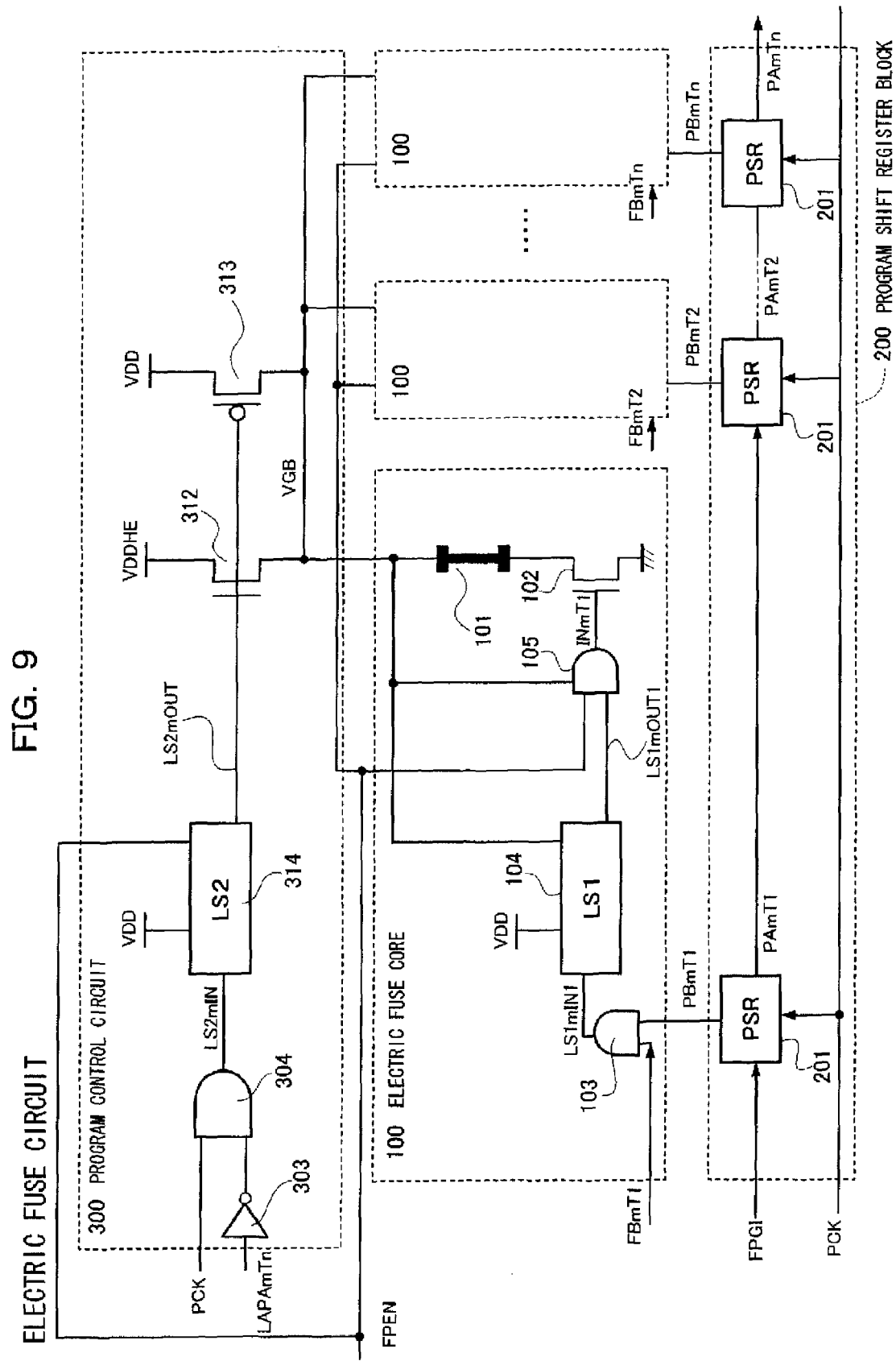
FIG. 9 is a circuit diagram showing the configuration of an electric fuse circuit according to Embodiment 4.

An electric fuse circuit according to Embodiment 4 of the present invention will be specifically described with reference to the drawings. FIG. 9 is a circuit diagram showing the configuration of the electric fuse circuit according to Embodiment 4. The same members as those described with reference to FIGS. 1 to 3, 5, 7, 11, and 12 are denoted by the same reference numerals and will thus not be described.

As is the case with Embodiment 1, the electric fuse circuit is made up of a plurality of (n) electric fuse cores 100, a program shift register block 200 having a plurality of (n) steps, and a program control circuit 300. The program shift register block 200 is the same as that described with reference to FIGS. 11 and 12 and will thus not be described. Furthermore, the electric fuse core 100 is the same as that described above in Embodiment 2 and will thus not be described.

In Embodiment 4, the fuse program enable signal FPEN is set to the VDDHE level for the programming operation and fixed to the L level for the non-programming operation, as is the case with Embodiment 1.

The electric fuse circuit according to Embodiment 4 differs from Embodiment 1 in that instead of the power source VDDHE, the fuse program enable signal FPEN is used as a high-voltage power source for the level shift circuit in the program control circuit 300. However, since the fuse program enable signal FPEN is set to the VDDHE level for the programming operation, the signal LS2mOUT, generated by the level shift circuit, is the same as that in Embodiment 1.

The electric fuse circuit according to Embodiment 4 differs from Embodiment 1 in that the NMOS transistor is used as a second switch transistor, whereas the PMOS transistor is used as a third switch transistor as is the case with Embodiments 2 and 3.

The electric fuse circuit according to Embodiment 4 also differs from Embodiment 1 in that the program control circuit 300 has no NAND circuit (see FIG. 1) and in that the signal LS2mOUT, generated by the level shift circuit, controls the turning-on and off operation of the second and third switch transistors.

A description will be given of differences in the program control circuit 300 from Embodiment 1. As shown in FIG. 9, the program control circuit 300 comprises a 3.3 V_IO NMOS transistor 312, which is the second switch transistor, a 3.3 V_IO PMOS transistor 313, which is the third switch transistor, an inverter circuit 303, an AND circuit 304, and a level shift circuit (LS2) 314.

The NMOS transistor 312 has a source connected to the power source VDDHE, a gate to which the signal LS2mOUT from the level shift circuit 314 is input, and a drain connected to the electric fuse elements 101. The PMOS transistor 313, located in parallel with the NMOS transistor 312, has a drain connected to the power source VDD, a gate to which the signal LS2mOUT from the level shift circuit 314 is input, and a source connected to the electric fuse elements 101. The NMOS transistor 312 and the PMOS transistor 313 generate the signal VGB.

Thus, the signal LS2mOUT from the level shift circuit 314 is input to the gates of both the NMOS transistor 312 and the PMOS transistor 313. Switching the signal LS2mOUT to the H level (VDDHE level) turns on the NMOS transistor 312, turns off the PMOS transistor 313, and switches the signal VGB to the VDDHE level. On the other hand, switching the signal LS2mOUT to the L level turns off the NMOS transistor 312, turns on the PMOS transistor 313, and switches the signal VGB to the VDD level.

Consequently, while the NMOS transistor 312 is on (during programming), the VDDHE-level voltage (first voltage) is applied to the electric fuse elements 101. While the PMOS transistor 313 is on (during non-programming), the VDD-level voltage (second voltage) is applied to the electric fuse elements 101.

The level shift circuit 314, to which the signal LS2mIN from the AND circuit 304 is input, uses the power source VDD and the fuse program enable signal FPEN as a power source to convert the VDD level into the VDDHE level. The signal LS2mOUT is input to the gates of both the NMOS transistor 312 and the PMOS transistor 313.

By thus using the fuse program enable signal FPEN to control the high-voltage power source for the level shift circuit 314 to, for example, fix the fuse program enable signal FPEN to the L level when the electric fuse circuit is powered on, the electric fuse element can be reliably prevented from being erroneously disconnected owing to malfunctioning of the level shift circuit 314.

With the above-described configuration, the program control circuit 300 internally generates the signal LS2mOUT, performing the clock operation in conjunction with the periodic clock operation of the program clock signal PCK. That is, every time the program clock signal PCK rises from the L level to the H level, the signal LS2mOUT switches to the H level (VDDHE level) and the signal VGB switches to the VDDHE level. Furthermore, every time the program clock signal PCK falls from the H level to the L level, the signal LS2mOUT switches to the L level and the signal VGB switches to the VDD level.

The program control circuit 300 thus alternately turns on the NMOS transistor 312 and the PMOS transistor 313 in synchronism with the clock signal to switch the signal VGB between the VDDHE level and the VDD level.

Furthermore, the fuse program enable signal FPEN controls the high-voltage power source for the level shift circuit 314 to allow the electric fuse element to be prevented from being erroneously disconnected owing to malfunctioning of the level shift circuit 314. Consequently, the NAND circuit (see FIG. 1) is removed from the program control circuit 300 so that the signal LS2mOUT, generated by the level shift circuit 314, controls the turning-on and -off operation of the second and third switch transistors (NMOS transistor 312 and PMOS transistor 313), which switch the signal VGB between the VDDHE level and the VDD level. Therefore, unlike Embodiment 1, Embodiment 4 does not generate the program enable switching signal PRGmIN.

Figure 10:
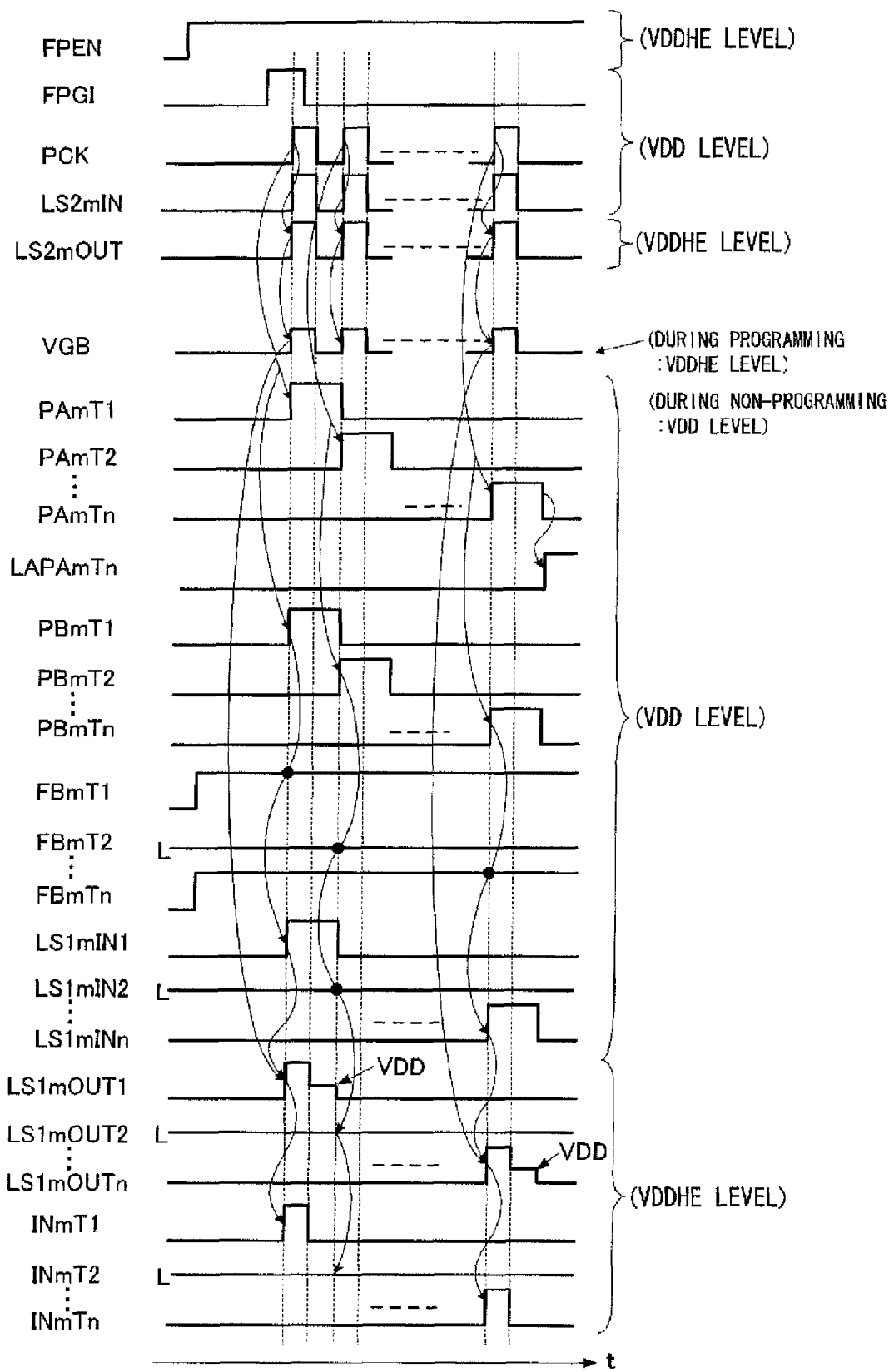
FIG. 10 is a waveform diagram showing the operation of the electric fuse circuit according to Embodiment 4.

FIG. 10 is a waveform diagram showing the operation of the electric fuse circuit according to Embodiment 4. As shown in FIG. 10, the operation of the electric fuse circuit according to Embodiment 4 of the present invention is almost the same as that of the electric fuse circuit according to Embodiment 1 (see FIG. 4).

The operation of the electric fuse circuit according to Embodiment 4 differs from that of the electric fuse circuit according to Embodiment 1 in that the program control circuit 300 has no NAND circuit so that the signal LS2mOUT, generated by the level shift circuit 314, controls the turning-on and -off operation of the second and third switch transistors (NMOS transistor 312 and PMOS transistor 313), preventing the generation of the program enable switching signal PRGmIN.

Embodiment 4 uses the fuse program enable signal FPEN, input through the control terminal independent of the power source, as a high-voltage power source for the level shift circuit 314. Thus, if for example, the electric fuse circuit is located on a system LSI chip and when a voltage drop in the power source wiring precludes the current capability of the NMOS transistor 312 from being sufficiently achieved, the current capability can be enhanced by increasing the voltage level of the signal FPEN, input through the control terminal which is not shown. The electric fuse element 101 can thus be stably programmed.

Alternatively, if the electric fuse circuit is used as a fuse element for RAM redundancy relief, even when the result of a RAM inspection with the power source voltage reduced indicates the presence of a defect, the current capability can be enhanced by increasing the voltage level of the signal FPEN input through the control terminal as described above. A program for switching to an acceptable RAM can thus be stably executed.

What is claimed is:

1. An electric fuse circuit which, during a programming operation, passes or does not pass a current through a fuse element to set the fuse element to one of a fused state and a non-fused state to program the fuse element, the electric fuse circuit comprising:

the fuse element, a first switch transistor, and a second switch transistor, the first switch transistor being connected in series with one end of the fuse element and the second switch transistor being connected in series with the other end of the fuse element, or the fuse element being connected in series with one end of the first switch transistor and the second switch transistor being connected in series with the other end of the first switch transistor, wherein a current is passed through the fuse element when both the first and second switch transistors are turned on.

2. The electric fuse circuit according to claim 1, wherein the electric fuse circuit has a plurality of fuse cores each comprising the fuse element and the first switch transistor and has the one second switch transistor.

3. The electric fuse circuit according to claim 1, further comprising a third switch transistor located in parallel with the second switch transistor, wherein to program the fuse element, the second switch transistor is turned on to apply a first voltage to the fuse element, and to avoid programming the fuse element, the third switch transistor is turned on to apply a second voltage lower than the first voltage to the fuse element.

4. The electric fuse circuit according to claim 3, wherein the second and third switch transistors are a P-type transistor and an N-type transistor, respectively, or an N-type transistor and a P-type transistor, respectively.

5. The electric fuse circuit according to claim 1, wherein the second switch transistor has a thicker gate oxide film than the first switch transistor.

6. The electric fuse circuit according to claim 1, wherein the first switch transistor has a thinner gate oxide film than the second switch transistor and is an N-type transistor.

7. The electric fuse circuit according to claim 1, wherein the second switch transistor has a thicker gate oxide film than the first switch transistor and is an N-type transistor.

8. The electric fuse circuit according to claim 1, further comprising a level shift circuit performing voltage conversion and provided on a signal wiring line connected to a gate of the second switch transistor, and the level shift circuit performs the voltage conversion only to program the fuse element.

9. The electric fuse circuit according to claim 1, further comprising a level shift circuit performing voltage conversion and provided on a signal wiring line connected to a gate of the first switch transistor, and the level shift circuit performs the voltage conversion only to set the fuse element to the fused state.

10. The electric fuse circuit according to claim 9, wherein the level shift circuit comprises only logic transistors.

11. The electric fuse circuit according to claim 9, wherein a voltage of a connection between the second switch transistor and the fuse element is used as a high-voltage power source for the level shift circuit.

12. The electric fuse circuit according to claim 9, wherein a voltage of a connection between the second switch transistor and the first switch transistor is used as a high-voltage power source for the level shift circuit.

13. The electric fuse circuit according to claim 1, further comprising a control terminal independent of a power source and a circuit that sets the first switch transistor to one of a program enable state and a disable state depending on a potential of the control terminal.

14. The electric fuse circuit according to claim 1, further comprising a control terminal independent of a power source and a circuit that sets the second switch transistor to one of a program enable state and a disable state depending on a potential of the control terminal.

15. The electric fuse circuit according to claim 13, further comprising a circuit that sets the second switch transistor to one of a program enable state and a disable state depending on the potential of the control terminal.

16. The electric fuse circuit according to claim 1, further comprising a control terminal independent of a power source, and a level shift circuit provided on a signal wiring line connected to a gate of the second switch transistor, the level shift circuit using voltage of a signal applied by the control terminal as a high-voltage power source to perform the voltage conversion, and the level shift circuit performs the voltage conversion only to program the fuse element.

17. The electric fuse circuit according to claim 1, further comprising a control terminal independent of a power source, and a level shift circuit provided on a signal wiring line connected to a gate of the first switch transistor, the level shift circuit using voltage of a signal applied by the control terminal as a high-voltage power source to perform the voltage conversion, and the level shift circuit performs the voltage conversion only to set the fuse element to the fused state.

18. The electric fuse circuit according to claim 1, further comprising a control terminal independent of a power source, and the second switch transistor performs a turning-on operation and a turning-off operation in accordance with a signal applied by the control terminal.

19. The electric fuse circuit according to claim 18, wherein the signal applied by the control terminal controls a gate of the second switch transistor.

20. The electric fuse circuit according to claim 1, having a function of, after all the fuse elements are programmed, receiving a program end signal to turn off the second switch transistor.

* * * * *